United States Patent [19]

Dhar

[11] Patent Number: 5,305,229
[45] Date of Patent: Apr. 19, 1994

[54] SWITCH-LEVEL TIMING SIMULATION BASED ON TWO-CONNECTED COMPONENTS

[75] Inventor: Sanjay Dhar, Long Valley, N.J.
[73] Assignee: Bell Communications Research, Inc., Livingston, N.J.
[21] Appl. No.: 756,078
[22] Filed: Sep. 6, 1991
[51] Int. Cl.$^5$ ............................................. G06F 15/20
[52] U.S. Cl. ................... 364/489; 364/488; 364/490; 364/578
[58] Field of Search ............... 364/489, 578, 491, 488

[56] References Cited

U.S. PATENT DOCUMENTS

| | | | |
|---|---|---|---|
| 4,815,024 | 3/1989 | Lewis | 364/578 |
| 4,817,012 | 3/1989 | Cali364 | 489/ |
| 4,827,428 | 5/1989 | Dunlop et al. | 364/491 |
| 4,835,726 | 5/1989 | Lewis | 364/802 |
| 4,907,180 | 3/1990 | Smith | 364/578 |
| 4,967,367 | 10/1990 | Piednoir | 364/489 |
| 5,095,454 | 3/1992 | Huang | 364/488 |
| 5,163,016 | 11/1992 | Har'el et al. | 364/578 |

OTHER PUBLICATIONS

D. G. Saab et al., "Delay Modeling and Timing of Bipolar Digital Circuits," 25th ACM/IEEE Design Automation Conference, 1988, pp. 288-293.
E. Cerny et al., "Magnetude Clanes in Switch-level Modeling," IEEE 1988 pp. 284-288.
AAJ de Lange et al., "A System for Hierarchical Constraint Graph Generation and Compaction for Symbolic Layout", IEEE, pp. 319-323.
Dan Adler, "Switch-Level Simulation Using Dynamic Graph Algorithms" IEEE 1991 pp. 346-355.
P. K. Chan et al., "Computing Signal Delay in General RC Networks by Tree/Link Partitioning," 26th ACM-/IEEE Design Automation Conference Jun. 1989 pp. 485-489.
D. T. Blaauw et al., "Derivation of Signal Flow for Switch-Level Simulation", IEEE 1990 pp. 301-305.
C. J. Terman, "Timing Simulation of Large Digital MOS Circuits," *Advances in Computer-Aided Engineering Design*, 1986, vol. 1, pp. 1-92.
P. Agrawal et al., "Automatic Modeling of Switch-Level Networks Using Partial Order," *IEEE Transactions on Computer-Aided Design of Integrated Circuits and Systems*, Jul., 1990, vol. 9, No. 7, pp. 696-708.
J. Rubinstein et al., "Signal Delay in RC Tree Networks," *IEEE Transactions on Computer-Aided Design*, Jul., 1983, vol. CAD-2, No. 3, pp. 202-210.
Tzu-Mu Lin et al., "Signal Delay in General RC Networks," *IEEE Transactions on Computer-Aided Design*, Oct., 1984, vol. CAD-3, No. 4, pp. 331-349.
G. Szymański, "Leadout: A Static Timing Analyzer for MOS Circuits," IEEE International Conference on Computer-Aided Design, 1986, Santa Clara, Calif., pp. 130-133.
W. C. Elmore, "The Transient Response of Damped Linear Networks with Particular Regard to Wideband Amplifiers," Journal of Applied Physics, Jan., 1948, vol. 19, No. 1, pp. 55-63.
N. Weste et al., Principles of CMOS VLSI Design, 1985, Addison-Wesley, Reading, Mass., pp. 317-319.
H. W. Jackson, Introduction to Electric Circuits, 1981, Prentice-Hall, Inglewood Cliffs, N.J., pp. 448-450.
R. E. Tarjan, "Depth-first search and linear graph algorithms," *SIAM Journal on Computing*, 1972, vol. 1, pp. 146-159.
J. E. Hopcroft et al., "Dividing a Graph into Triconnected Components," *SIAM Journal on Computing*, Sep., 1973, vol. 2, No. 3, pp. 135-158.
R. E. Tarjan, Data Structures and Network Algorithms, Society for Industrial and Applied Mathematics, 1983, Philadelphia, pp. 85-96.
R. E. Bryant, "A Survey of Switch-Level Algorithms," IEEE Design & Test, Aug., 1987, pp. 26-40.
R. E. Bryant, "A Switch-level Model and Simulator for MOS Digital Systems," *IEEE Transactions on Computer*, Feb., 1984, pp. 160-177.

Primary Examiner—Thomas G. Black
Assistant Examiner—Tan Q. Nguyen
Attorney, Agent, or Firm—Leonard Charles Suchyta; James W. Falk

[57] ABSTRACT

A method for simulating a transistor circuit determines which nodes in the circuit change state in response to events, and then accurately computes the times at which those nodes change states. Using parasitic capacitance and transistor conductance values extracted from the circuit layout, this method and evaluates driving-point resistances and delays in an RC-network representation of the complete circuit.

6 Claims, 19 Drawing Sheets $$c(i) = \frac{RCc(i)}{rc(i)} + \frac{RCc(m)}{r(i,m,n,j)}$$

$$c(j) = c(j) + \frac{RCc(j)}{rc(j)} + \frac{RCc(n)}{r(i,m,n,j)}$$

SWITCH-LEVEL TIMING SIMULATION BASED ON TWO-CONNECTED COMPONENTS

I. BACKGROUND OF THE INVENTION

This invention relates generally to the simulation of electronic circuits, and more particularly to the simulation of such circuits at a switch level.

Digital MOS circuits, including high-speed full-custom chips, can consist of a few hundred thousand transistors. In fact, circuits of this size are now commonplace with the advent of Very Large Scale Integration (VLSI). After these circuits are designed, they are modeled (i.e., simulated) before being fabricated in silicon. This is because silicon fabrication is costly and time-consuming, and because simulation allows the operation of the circuits to be tested and analyzed relatively easily and inexpensively before fabrication.

Digital MOS circuits can be simulated at various levels of detail depending upon the amount of precision of the information required. For example, transistor-level simulation, which is very detailed, greatly increases the probability of the circuit working correctly when it is first fabricated in silicon. In addition, errors in layout, design, and timing that may be impossible to detect by other methods can be detected by a transistor-level simulation of the complete circuit.

The more detailed the level, however, the smaller the circuit that can be simulated in any reasonable amount of time. Transistor-level simulation is so slow and difficult to use that is not appropriate for very large circuits.

Simulations of large digital MOS circuits are usually performed with either gate-level modeling or switch-level modeling. Gate-level modeling, which involves building circuits from predetermined logic gate models, can validate the logic behavior of certain circuits, such as those designed in a standard-cell system that have validated gate-level models. For full custom circuits, however, gate-level modeling is inadequate because it does not properly simulate certain MOS circuit phenomena, such as bidirectional signal flow, resistance-ratio effects, and charge-sharing.

Switch-level modeling, which is exemplified in FIG. 1, addresses the drawbacks of gate-level modeling and transistor-level modeling. In switch-level modeling, each transistor 100 is replaced by a switch 110 having a conduction path 120 with a given resistance value represented as element 125. Depending upon the signal at a gate 130, switch 110 is either closed or opened thereby placing conduction path 120 into or out of the remaining circuit.

Switch-level modeling is not only relatively fast, it is more accurate than gate-level modeling because gate-level modeling uses specific input/output relationships which may not fit each circuit accurately. The speed and accuracy of switch-level modeling are two reasons that it is commonly used to simulate very large circuits, such as those with more than one hundred thousand transistors.

Most switch-level simulators, however, provide detail only at the logic simulation or state level and do not provide any timing information. Such pure logic simulation gives information about the logic-levels of signals without regard to the actual timing (i.e. delays) associated with signal changes.

Timing simulation is useful and sometimes necessary to obtain details about the signal waveform and information about when and how fast signals change. Some switch-level simulators provide details about the timing delays associated with signal changes. This is done, as shown by FIG. 2, by treating each node 200 of a circuit as a node 210 with an associated capacitance value 215 to ground.

Some conventional switch-level simulators model transistor conductances and node capacitances by "strengths," either from a discrete or a continuous set. "Strengths" are approximations of transistor conductances. Certain switch-level simulators provide timing by using these "strengths" as a measure of the node conductances from which delays are computed. Strengths and the delays calculated from strengths are only crude approximations of actual node conductance and circuit delay, however. The inaccuracy of these approximations is the principal source of timing inaccuracy by such conventional switch level simulators and the principal reason why most switch-level simulators are unable to resolve the output of a circuit correctly if dynamic logic is present.

The inability of conventional switch-level simulators to resolve the output of a circuit correctly will be illustrated by the exclusive OR circuit 300 shown in FIG. 3. Circuit 300 includes three drivers 310, 320, and 330. Driver 310, which is composed of transistors 315 and 317, receives an A input inverted. Driver 320, which is composed of transistors 325 and 327, receives a B input inverted. Driver 330, which is composed of transistors 335 and 337, is connected to the output of driver 320. Circuit 300 also includes exclusive OR gate 340, which is composed of transistors 342, 344, 346, and 348.

Conventional switch-level simulators which rely on strength propagation to determine the logic-levels in the circuit operate by propagating strengths across transistor channels. Thus, a node is assigned a strength equal to the smaller of the strength of the transistor and the strength of the node connected by the transistor. For such a mechanism to produce the correct result for circuit 300, the strengths of the six transistors 315, 317, 325, 327, 335 and 337 in the drivers 310, 320 and 330 have to be larger than the strengths of the four transistors 342, 344, 346 and 348 in exclusive OR gate 340. In actual design, this is usually not true. Therefore, this type of conventional switch-level simulator will not be able to simulate such a circuit correctly.

Another attempt to improve the accuracy of simulators has been the development of techniques for computing delay in certain circuits. Efficient algorithms to compute delay have previously been developed only for tree RC-networks. In tree RC-networks, there are no loops. Such algorithms can therefore not be used for the majority of circuits because most circuits do have loops.

Recently, two different techniques have been developed for determining delay in general RC-networks One technique is relaxation-based and appears to have a computation complexity of $O(n^3)$. The other technique has a computation complexity of $O(n^3)$ for planar networks and $O(n^6)$ for general networks this complexity is disadvantageous.

It would therefore be desirable to provide a system for switch-level modeling which generates accurate timing information.

Another desirable feature would be to provide such a system without large computation complexity.

It would also be desirable to provide a simulation system which executes rapidly.

II. SUMMARY OF THE INVENTION

In order to achieve the desires indicated above, this invention performs switch-level timing simulation by determining which nodes in the circuit change state in response to events, and then accurately computes the times at which those nodes change states. To do so, this invention uses parasitic capacitance and transistor conductance values extracted from the circuit layout to evaluate driving-point resistances and delays in an RC-network representation of the complete circuit without making a tree approximation of the circuit. This results in a much greater ability to resolve circuit outputs correctly, to obtain considerable timing accuracy, and to achieve these accuracies at high execution speeds.

Preferably, a given circuit is first separated into channel-connected components which each consist of all nodes and transistors that can be reached from a node by traversing the source-drain channels of transistors. Each channel-connected component is then represented as a graph consisting of nodes and edges. Each edge in the graph corresponds to a transistor and represents the drain-source channel connection for the corresponding transistor. Each node in the graph corresponds to a circuit node at which transistors are interconnected. The graph representing each channel-connected component is separated into biconnected components which are subgraphs that cannot be separated into two unconnected parts by removing any single node and all the edges incident on that node. Each biconnected component is then reduced as far as possible by series-parallel reduction. This results in the identification of biconnected components that are two-connected (which get reduced to a single node) and the ones that are triconnected (which do not get reduced to a single node). The reduced component is then unfolded and organized into cycles with increasing levels of nesting. This representation in the form of cycles at increasing levels of nesting allows the computation of driving-point resistances and delays accurately and with high speed.

In accordance with the invention, a method of simulating a circuit of transistors and reference nodes comprises the steps, executed by a data processor, of modeling the transistor circuit as a plurality of switches each corresponding to a different one of the transistors, and each of the switches containing a gate and two nodes connected by a corresponding channel having a resistance value such that each channel is considered conducting or non-conducting according to a state of the corresponding gate; defining a state configuration for a given state of the modeled circuit, the defined state configuration containing the conducting ones of the channels; determining, from the resistance values for the channels in the defined state configuration, driving-point resistances between each of the nodes in the defined state configuration and the reference nodes; and identifying a next state for the modeled circuit from the driving-point resistances.

III. BRIEF DESCRIPTION OF THE DRAWINGS

The accompanying drawings, which are incorporated in and constitute a part of this specification, illustrate implementations of the invention and, together with the description, serve to explain the objects, advantages, desires, and principles of the invention.

Figure 6:
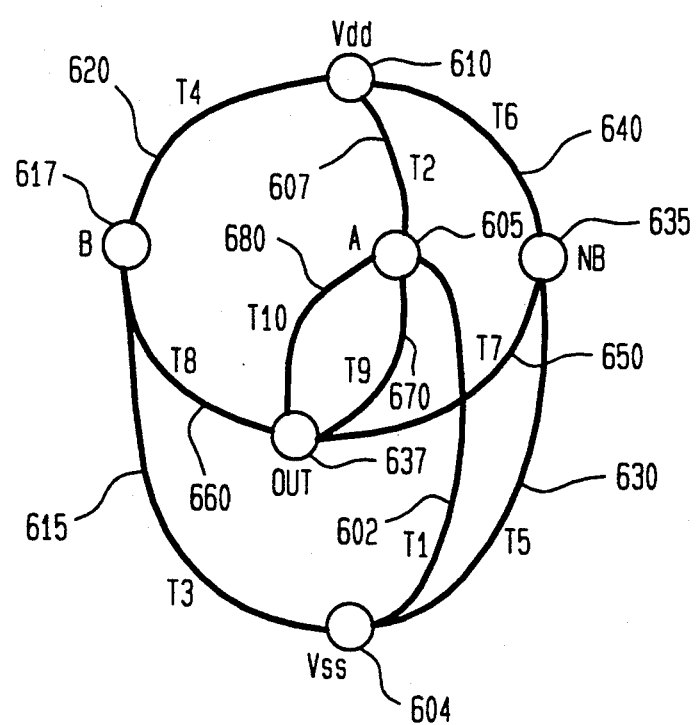
FIG. 6 shows a graph of the exclusive OR circuit in FIG. 3.
Figure 12A:
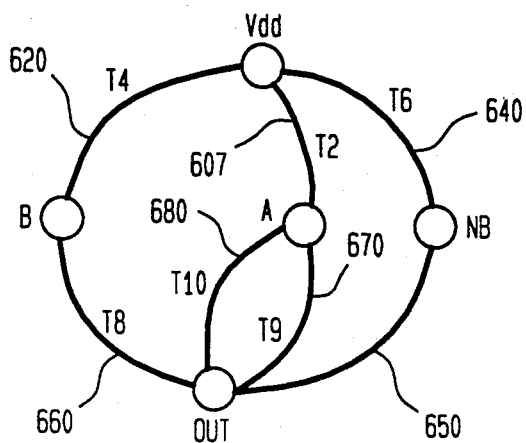
Figure 12B:
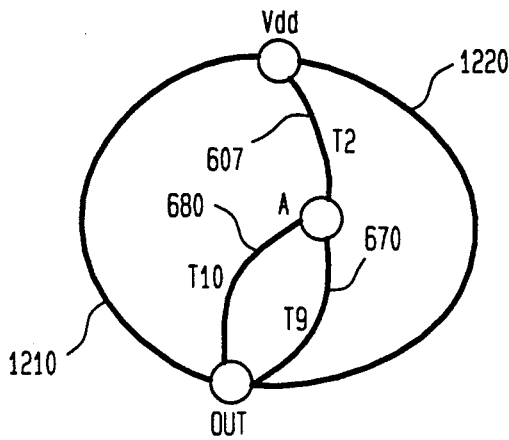
Figure 12C:
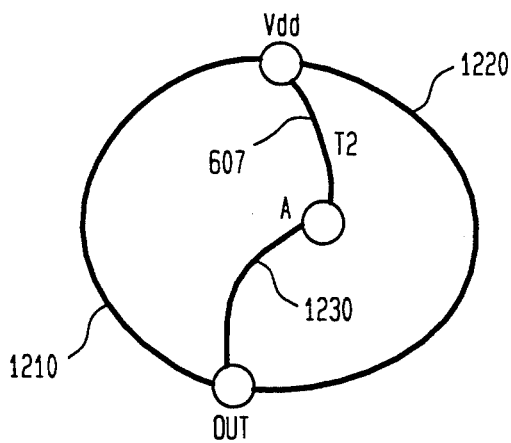
Figure 12D:
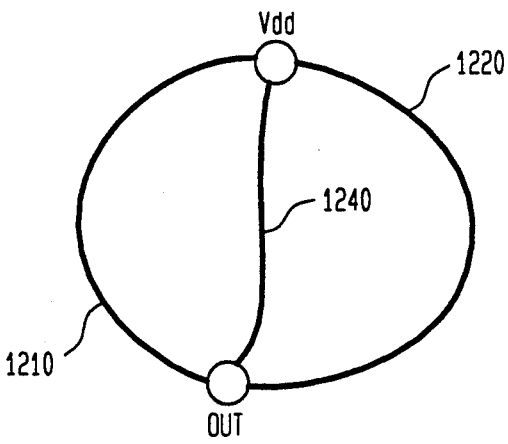
Figure 12E:
Figure 12F:
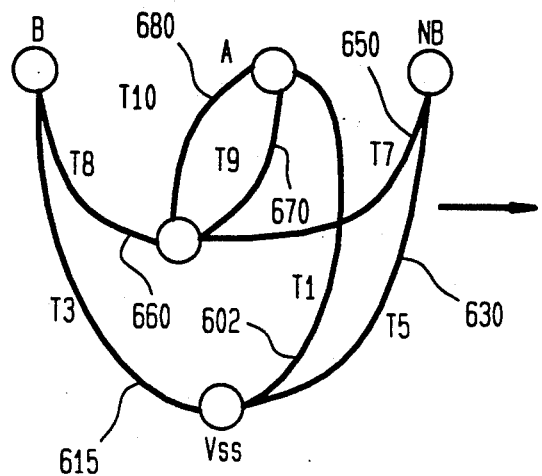
Figure 12G:
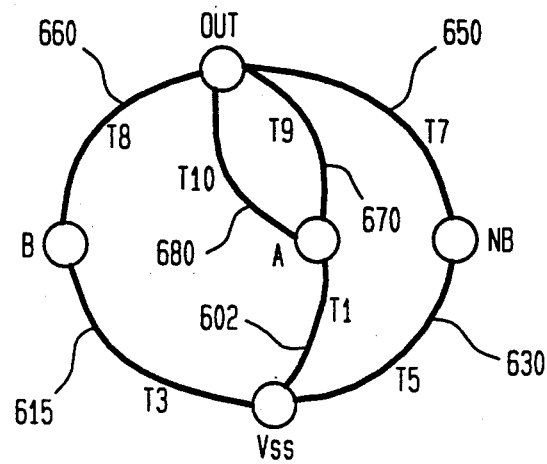
Figure 13:
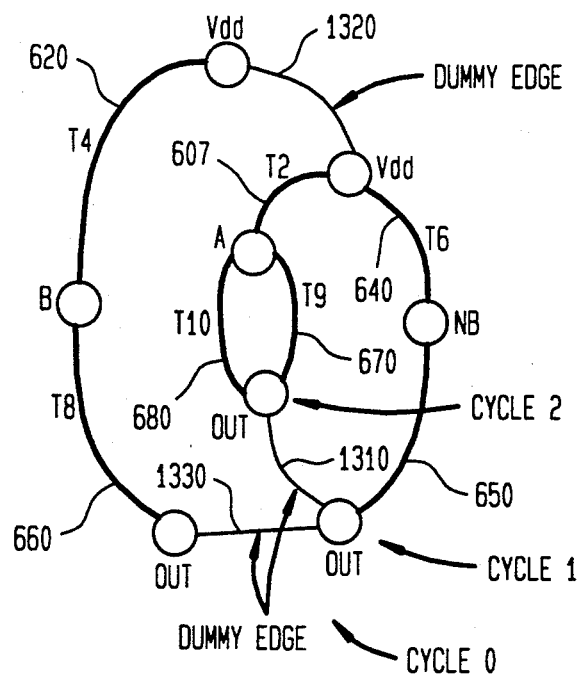

FIGS. 12A-E show various stages of reducing the graph in FIG. 6;

FIGS. 12F and 12G are alternate representations of portions of the graph in FIG. 6;

FIG. 13 shows a flow diagram of a method for organizing the levels of nested cycles.

Figure 14:
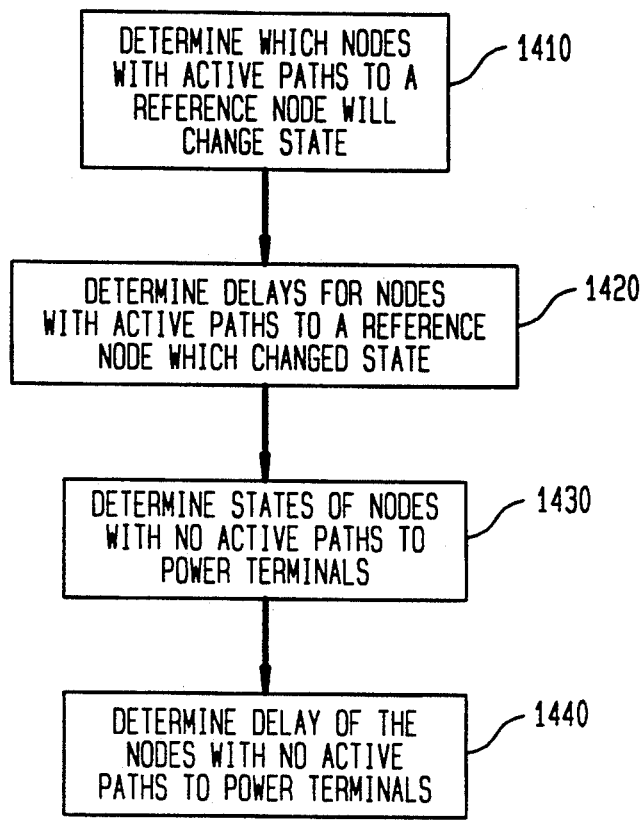

FIG. 14 shows a flow diagram of a method of simulation in accordance with the present invention.

Figure 15:
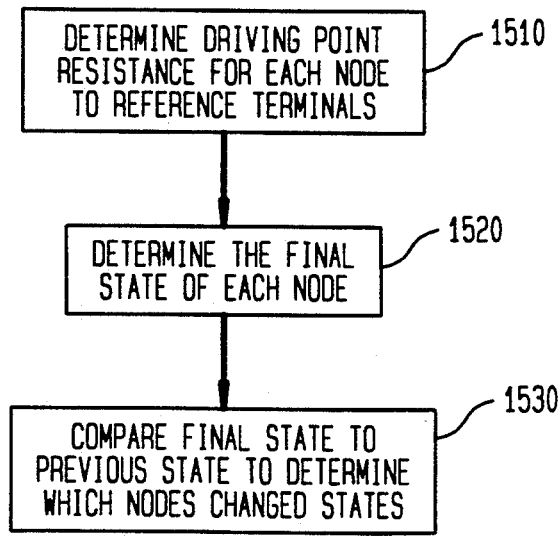
Figure 16:
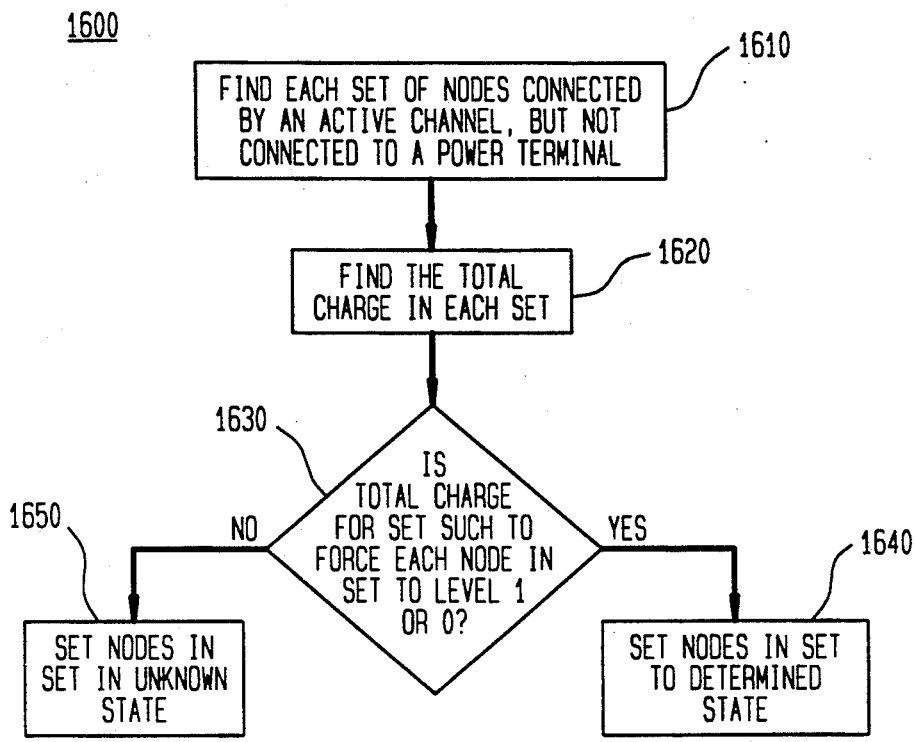
Figure 17:
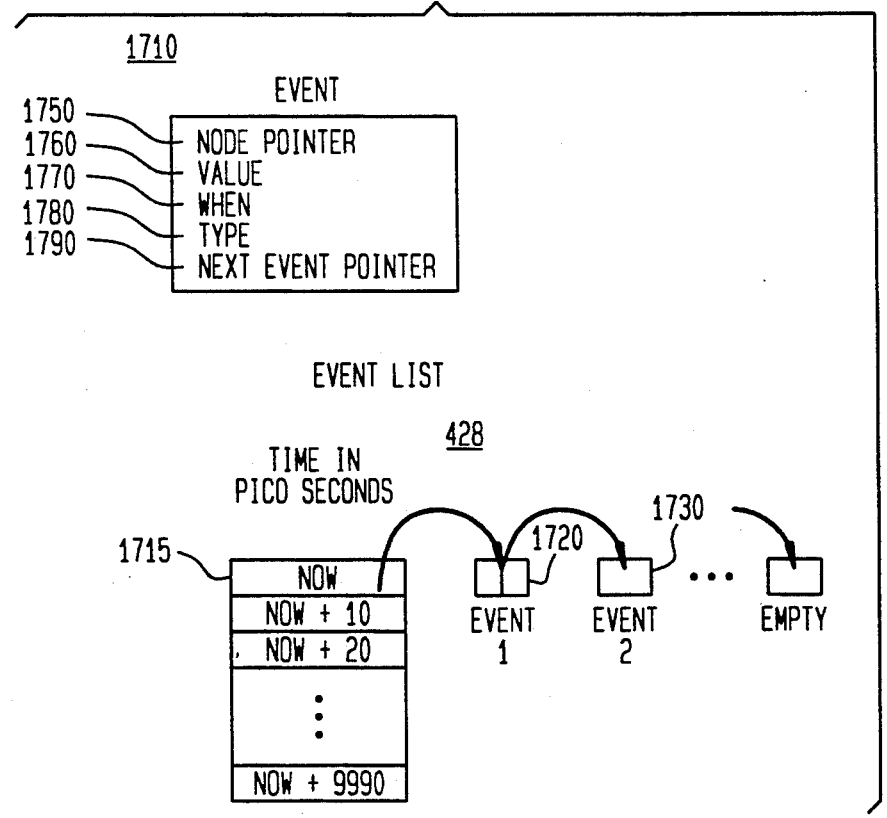
Figure 18:
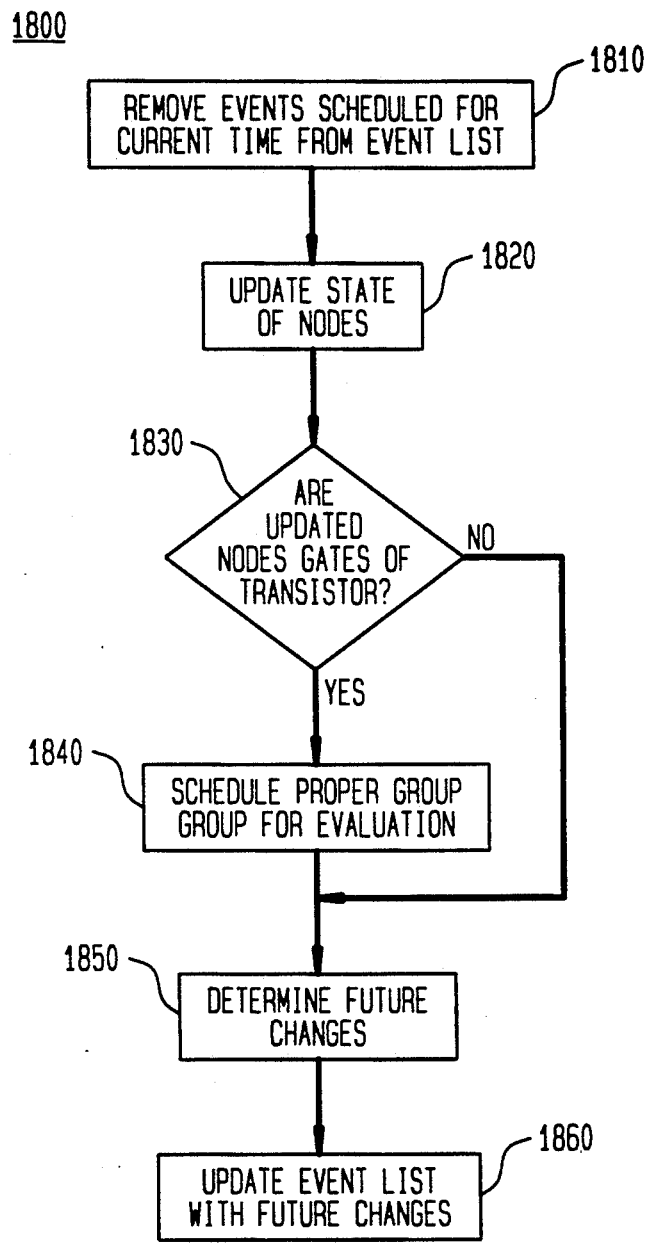
Figure 19:
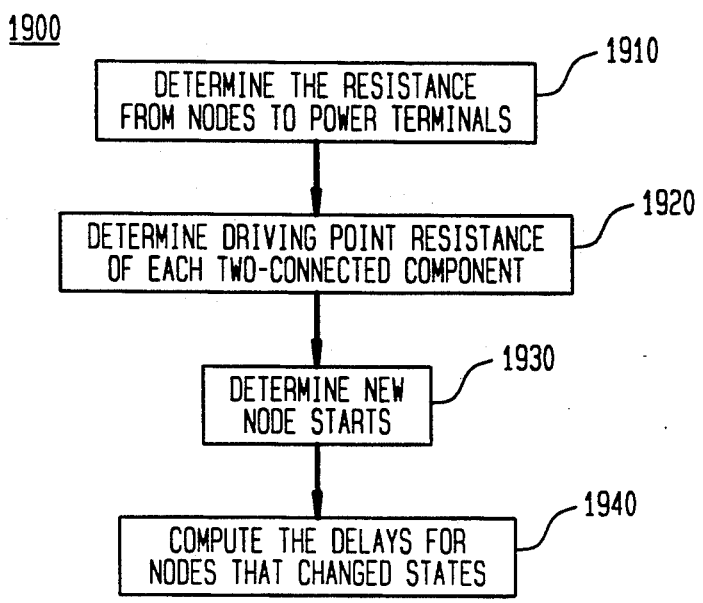
Figure 20:
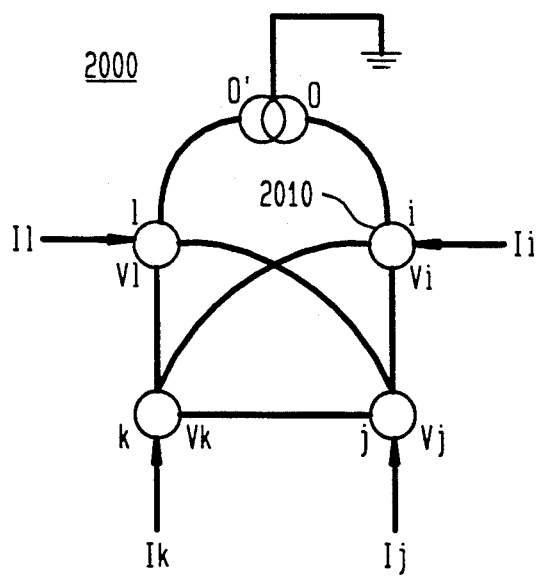
Figure 21:
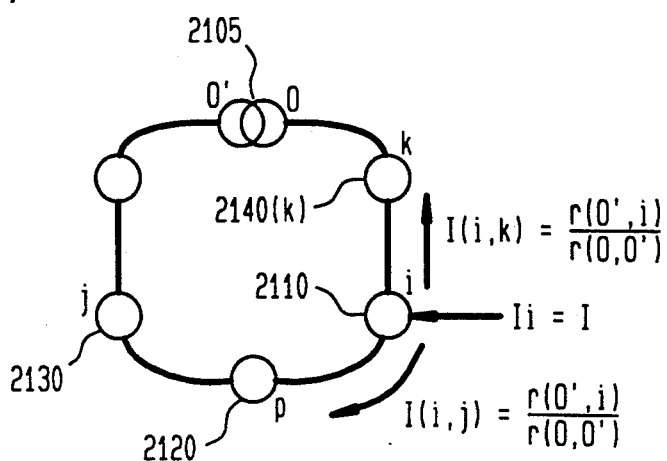
Figure 22A:
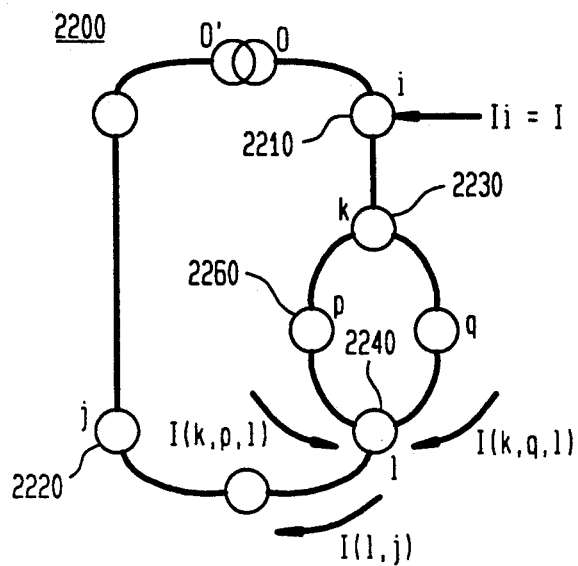
Figure 22B:
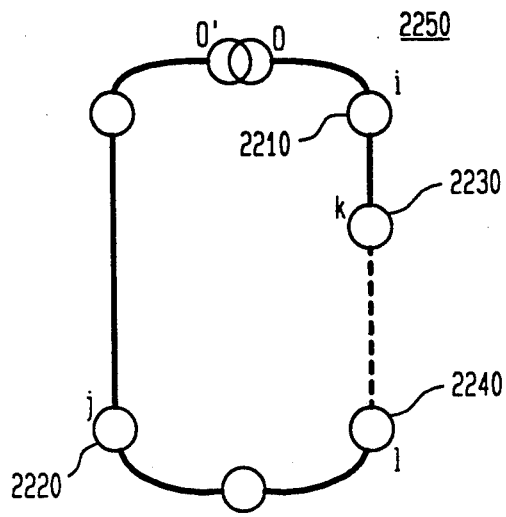
Figure 23:
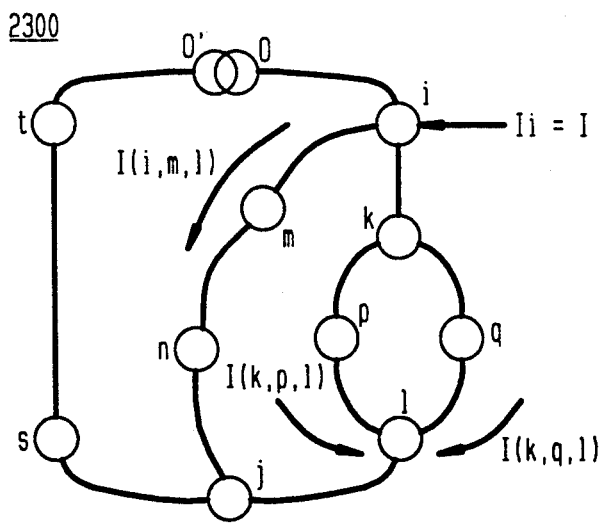
Figure 24:
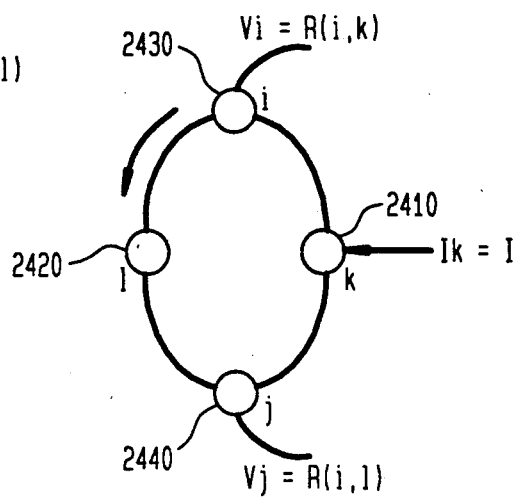

FIG. 15 shows a flow diagram of a method of determining which nodes will change state;

FIG. 16 is a flow diagram of a preferred method of determining charge sharing;

FIG. 17 is a diagram of an event list;

FIG. 18 is a flow diagram of a preferred method of handling events;

FIG. 19 is a flow diagram of a preferred method for evaluating triconnected components;

FIG. 20 shows an RC-network used to describe transfer resistance;

FIG. 21 is a diagram of a two-connected network;

FIG. 22A and 22B are two-connected networks which are used to show the determination of transfer resistances in accordance with the preferred implementation of this invention;

FIG. 23 shows a network 2300 with two levels of nesting;

FIG. 24 shows a network for computing transfer resistances between nodes which are on the same level that is greater than level 0.

Figure 25A:
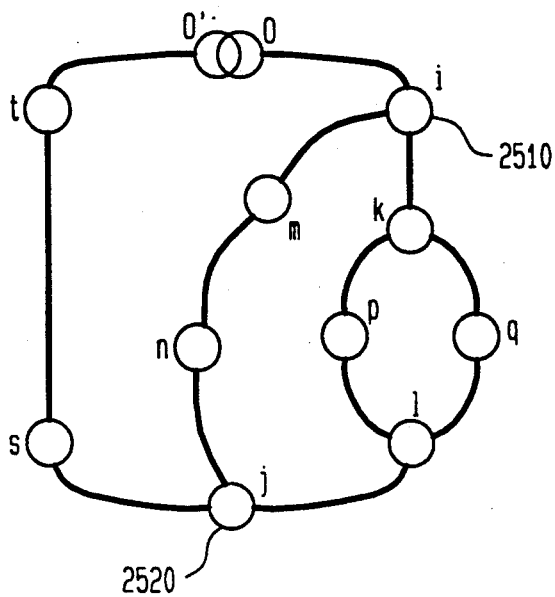
Figure 25B:
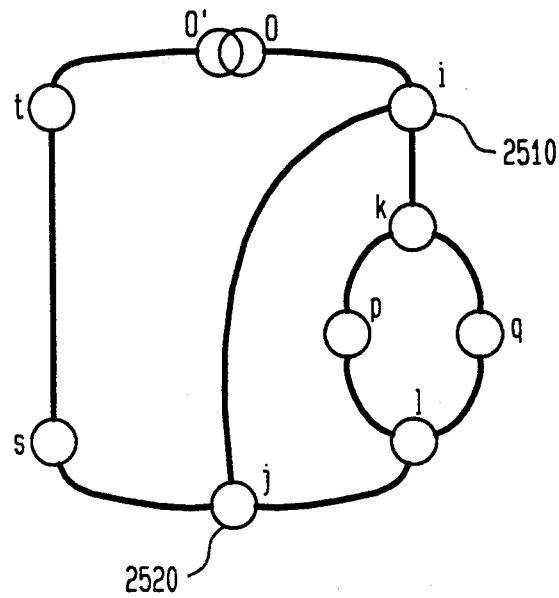
Figure 25C:
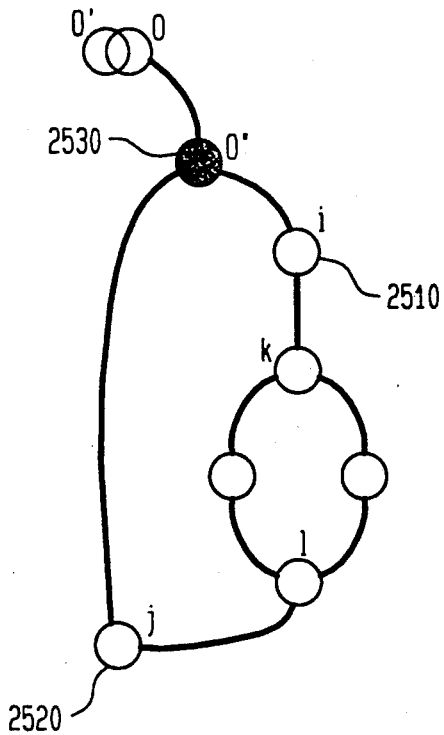
Figure 26:
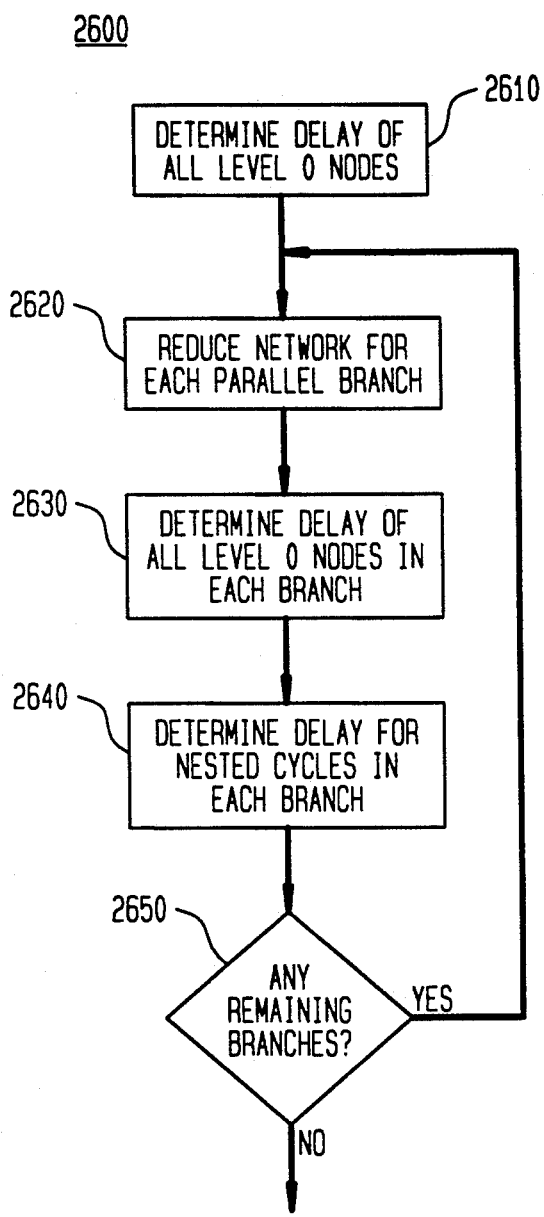
Figure 27:
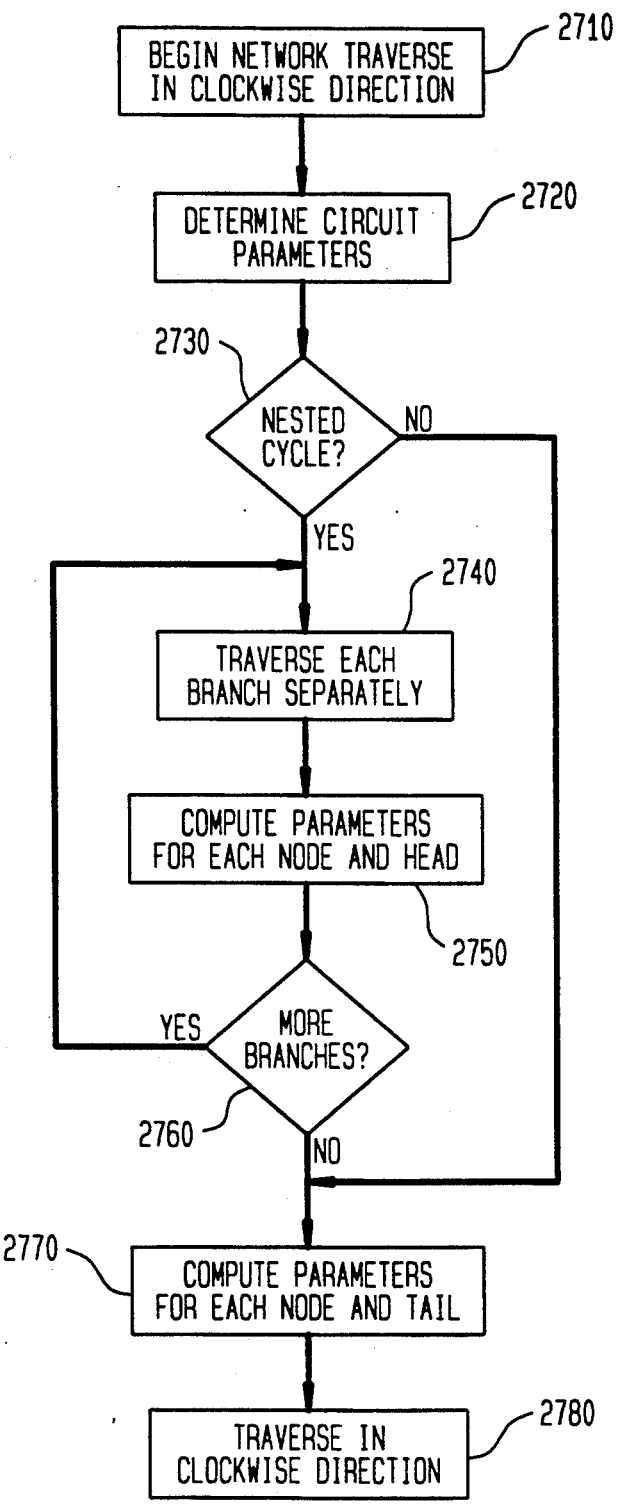
Figure 29A:
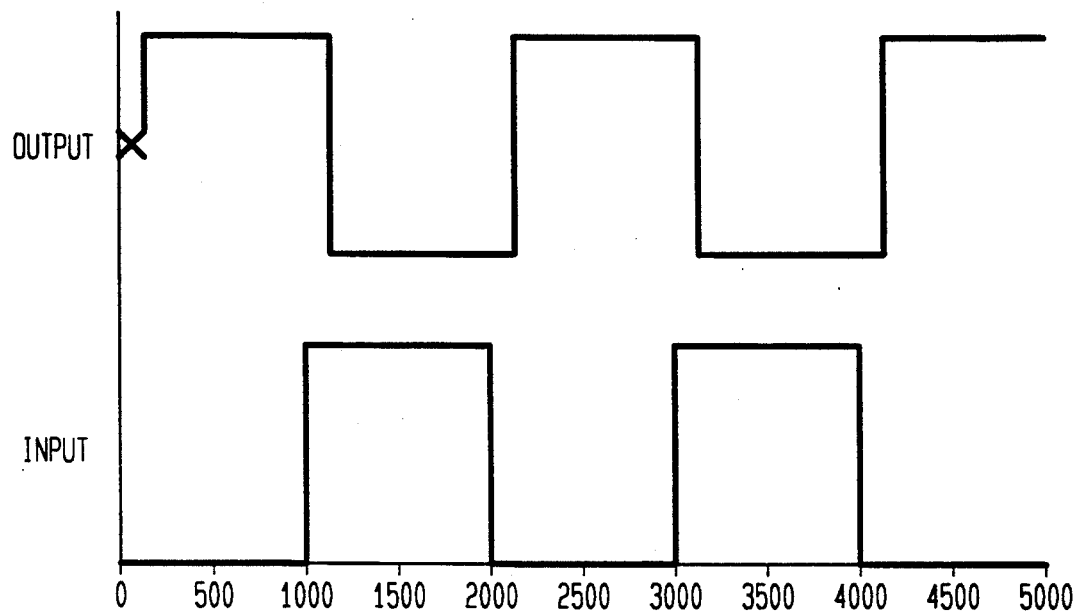
Figure 29B:
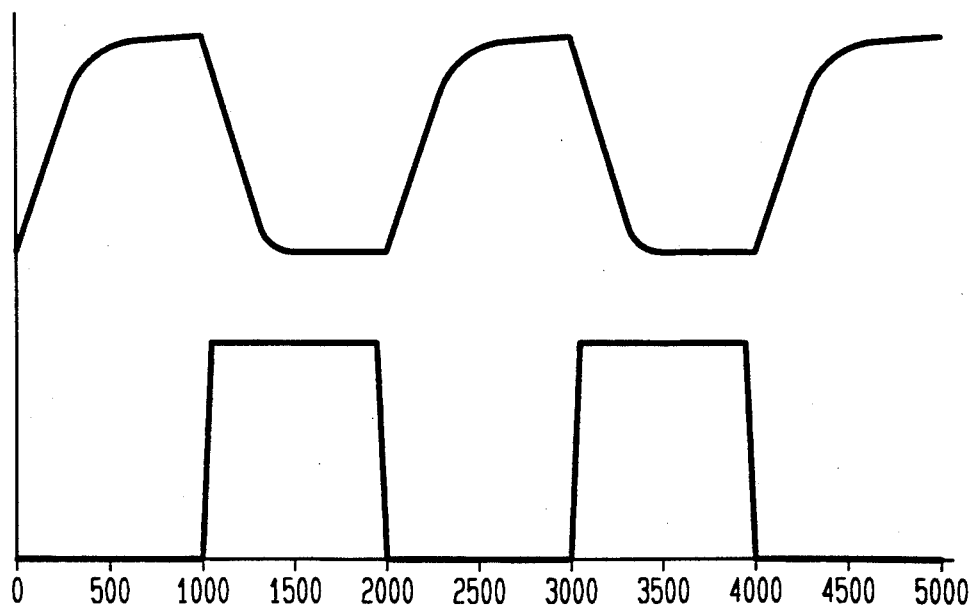
Figure 30A:
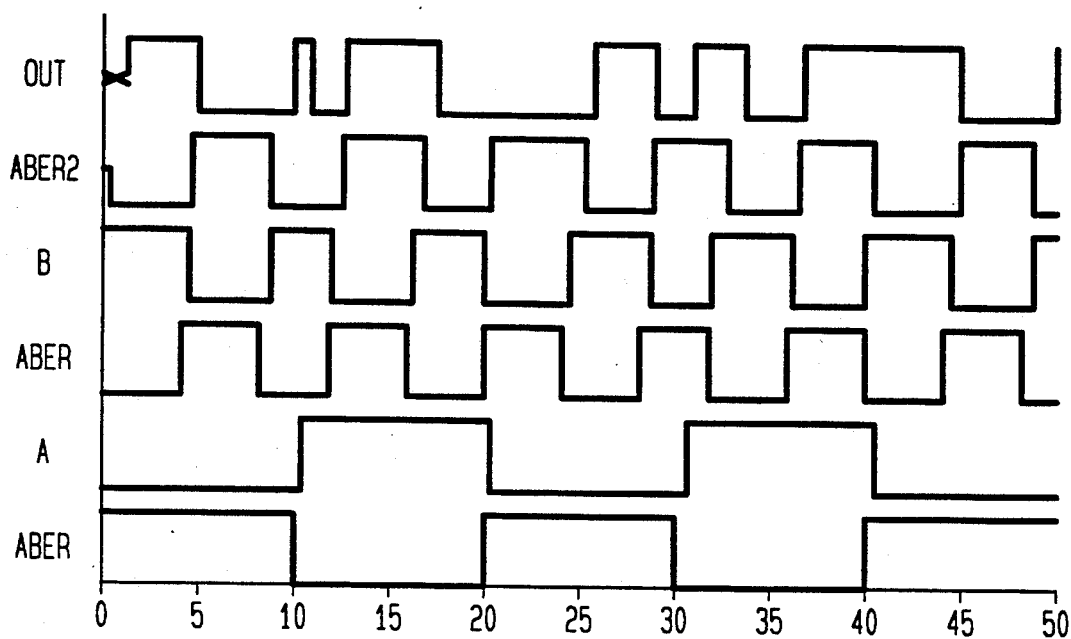
Figure 30B:
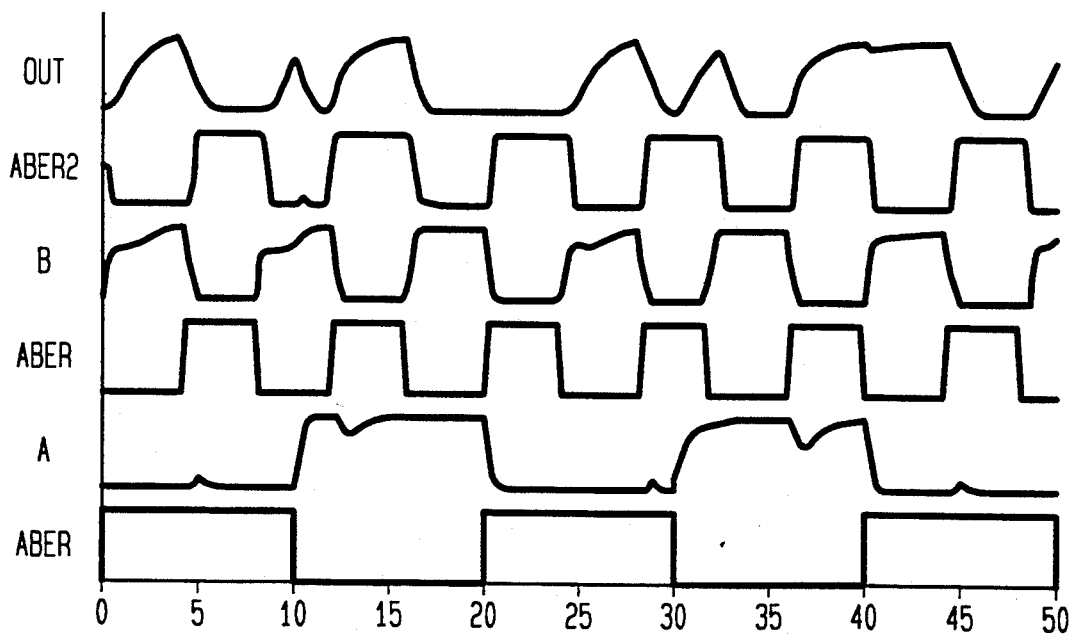

FIG. 25A-C are various stages of a circuit shown to demonstrate a mechanism for capacitance distribution;

FIG. 26 is a flow chart for a preferred method of determining the delays of each node whose level has changed;

FIG. 27 is a flow diagram of a preferred method for traversing a circuit network;

FIGS. 28A-L show networks for computing delays at at level 1;

FIGS. 29A and 29B show responses for different simulations of an inverter circuit; and FIGS. 30A and 30B show responses from different simulations of an exclusive or circuit.

IV. DETAILED DESCRIPTION OF PREFERRED IMPLEMENTATIONS

Reference will now be made in detail to the construction and operation of preferred implementations of the present invention which are illustrated in the accompanying drawings. In those drawings, like elements and operations are designated with the same reference numbers.

The following descriptions of the preferred implementations of the present invention are only exemplary of the invention. The present invention is not limited to these implementations, but may be realized by other implementations.

A. System Overview

Figure 1:
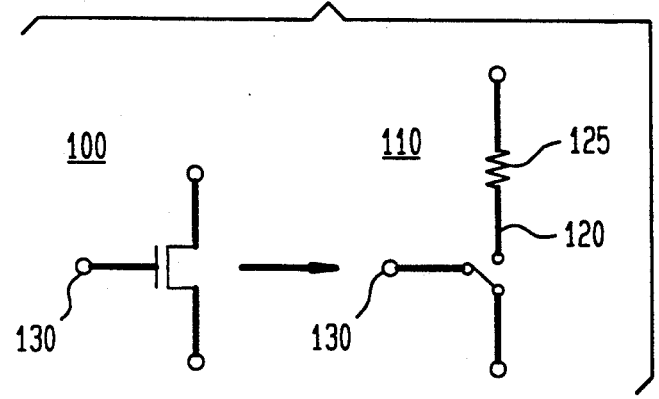
FIG. 1 shows a representation of a transistor for switch-level modeling.
Figure 2:
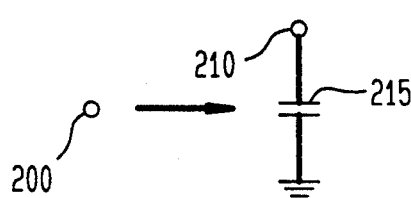
FIG. 2 shows a representation for a node in switch-level modeling.
Figure 4:
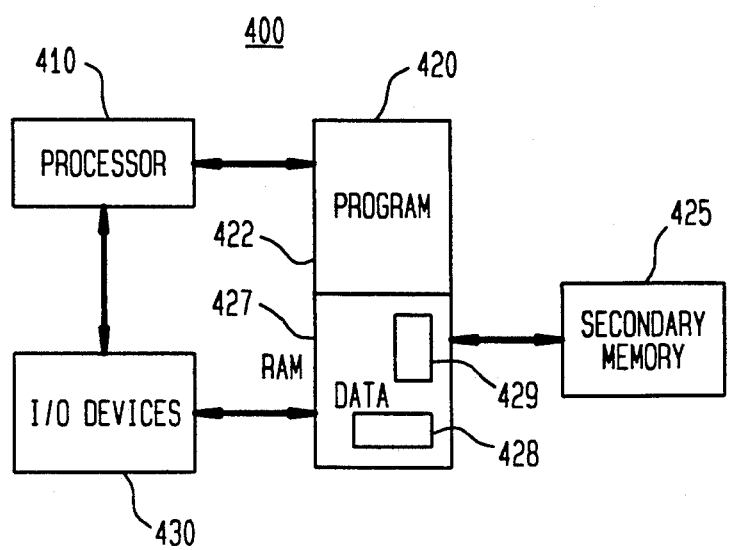
FIG. 4 is a diagram of a computer system which can be used to execute the simulation methods of this invention.

FIG. 4 is a diagram of a computer system 400 which can be used to execute the simulation methods of this invention. Preferably, computer system 400 includes a processor 410, a random access memory 420, a secondary memory 425 (such as tapes or disks), and input/output devices 430. Processor 410 can be any type of processor with sufficient power and speed to execute the methods described below rapidly and efficiently. One example of such a processor is in the SPARC workstation manufactured by Sun Microsystems.

In the preferred implementation, processor 410 executes a compiler, which converts the simulated circuit information into a usable format, and a switch-level simulator, which models the circuit operation and timing. The preferred implementation of the simulator has an interactive user interface which, among other things, permits detailed exploration of the simulated circuit.

Preferably, random access memory 420 includes a program section 422 and a data section 427. Program section 422 stores the compiler and simulator programs, and data section 427 includes network data representing the circuits to be simulated and event data indicating when nodes will change state. The network data, which is stored in a circuit net list 429, and the event data, which is stored in an event list 428, are discussed in greater detail below. It should be recognized that although FIG. 4 shows memory 420 as divided into discrete portions, this is merely to represent the contents of random access memory 410, not to indicate the precise locations of those contents.

Input/output devices 430 generally include peripheral devices such as a monitor, a printer, and some devices. Preferably monitors display and printers print the signals produced by the selected nodes during simulation. The input devices, such as a keyboard or a mouse, are used to receive user input.

B. Switch-Level Simulation

Figures 5, 7:
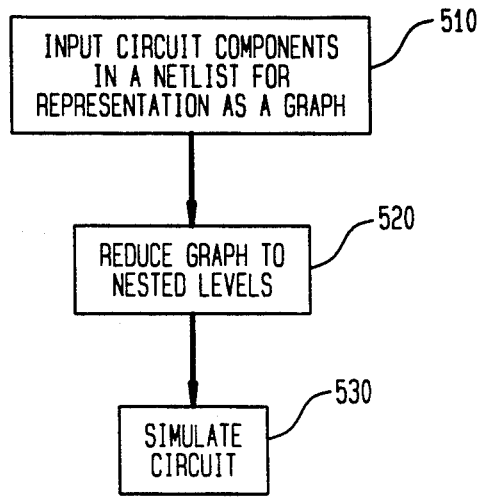
FIG. 5 shows a general flow diagram of a preferred method of simulating circuits at a switch-level in accordance with the present invention.
FIG. 7 shows a detailed representation of a net list shown in FIG. 4.

FIG. 5 shows a general flow diagram 500 of a preferred method of simulating circuits at a switch level in accordance with the present invention. The steps in flow diagram 500 are carried out by computer system 400.

1. Circuit Compilation

The first step in flow diagram 500 is to input the circuit components and connections in a form, such as net list described below, that will allow application of the simulation techniques of the invention (step 510). In one preferred implementation, the circuit is represented by a higher order language. A computer converts that language to a binary format. The binary data is then stored in net list 429 (FIG. 4) which has an entry for each transistor. Before describing net list 429, however, it is necessary to understand the preferred method of representing circuits.

Figure 3:
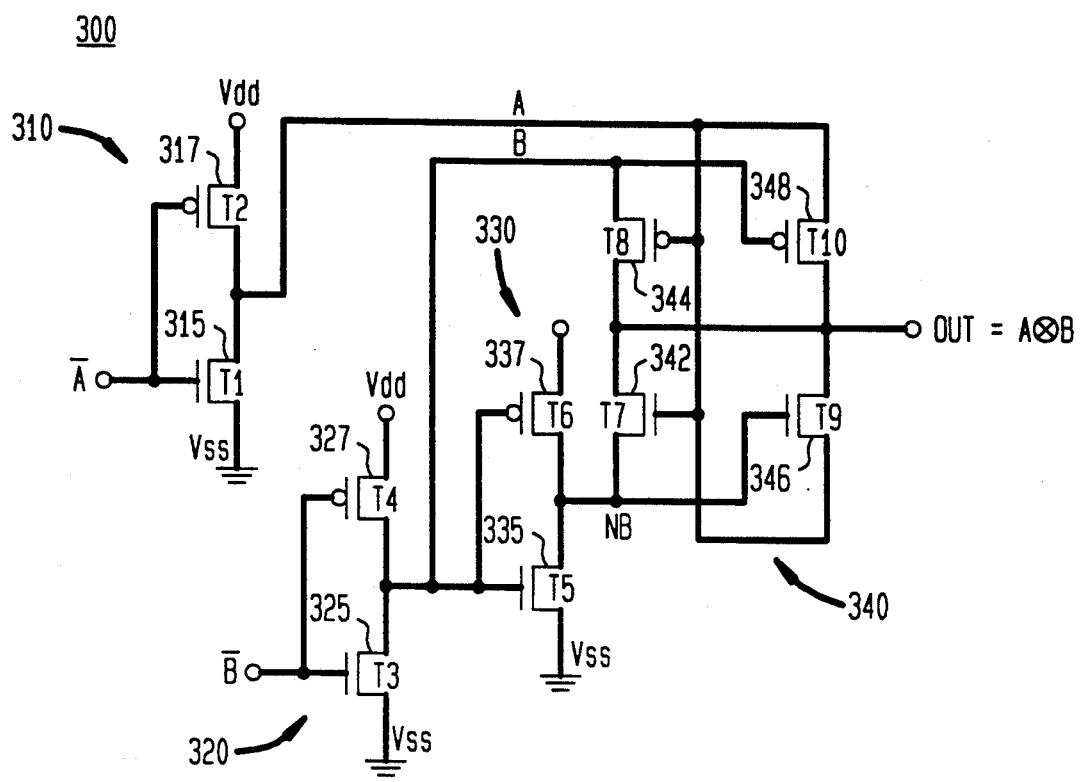
FIG. 3 shows a transistor implementation of an exclusive OR circuit.

For simulation to take place, the circuit must be represented in a form which computer system 400 can manipulate. A transistor circuit, such as exclusive OR circuit 300 in FIG. 3, is actually a network of transistors interconnected in some fashion.

In the preferred implementation, each circuit is represented as a graph of nodes interconnected by edges. FIG. 6 shows a graph 600 of the circuit 300 in FIG. 3. Graph 600 only contains the channels of each transistor; the gates are not shown because relatively little current flows through the gates as opposed to the channels. Each channel is represented in a graph of the circuit as an edge connecting the corresponding drain and source nodes. For example, transistor 315 is represented by edge 602 connecting nodes 604 and 605; transistor 317 is represented by edge 607 connecting nodes 605 and 610; transistor 325 is represented by edge 615 connecting nodes 604 and 617; transistor 327 is represented by edge 620 connecting nodes 617 and 610; transistor 335 is represented by edge 630 connecting nodes 604 and 635; and transistor 337 is represented by edge 640 connecting nodes 635 and 610. In exclusive OR gate 340, transistor 342 is represented by edge 650 connecting nodes 635 and 637; transistor 344 is represented by edge 660 connecting nodes 617 and 637; transistor 346 is represented by edge 670 connecting nodes 605 and 637; and transistor 348 is represented by edge 680 also connecting nodes 605 and 637.

Net list 429, shown in detail in FIG. 7, is a preferred structure for storing information about the edges and nodes to represent the transistors in the circuit to be simulated. Each entry or row in net list 700 corresponds to a different transistor and represents a corresponding edge. The information associated with each edge 710 includes the resistance value 715 of the channel of the corresponding transistor, the nodes 720 and 730 connected by the corresponding edge, the capacitance values 725 and 735 of those nodes, an identification of the node 740 which is the gate of the corresponding transistor, and a conduction/ nonconduction flag 750 indicating whether the corresponding transistor is conducting in the current state.

The information in net list 429 thus not only reflects the connection of the nodes by the edges, but also includes the resistance and capacitance information needed for determining the logic levels and timing.

2. Graph Reduction

Returning to flow diagram 500, once a graph representation of the circuit is properly stored in net list 700, computer system 400 reduces the graph for analysis (Step 520). One of the purposes of graph reduction is to find nesting levels of the loops in the graph.

Figure 8:
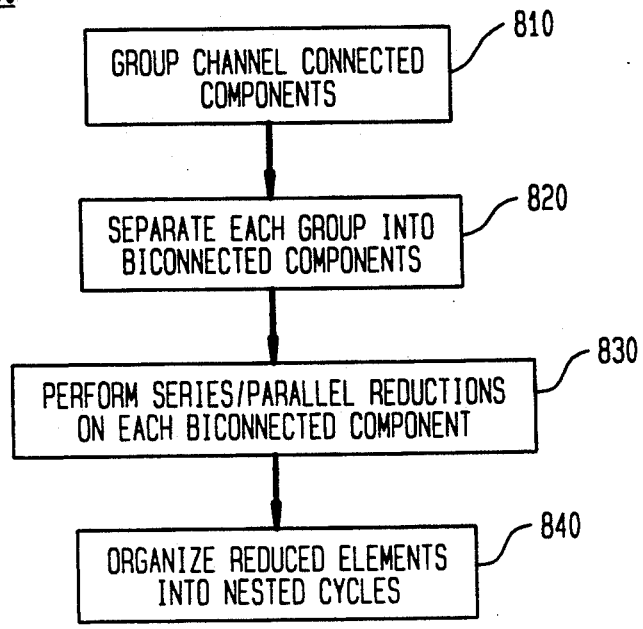
FIG. 8 shows a flow diagram of a method for reducing a graph.

FIG. 8 shows a flow diagram 800 of a method for reducing a graph. The first step of flow diagram 800 is to execute a routine to separate the graph for the circuit into its channel-connected components, or groups (step 810). A group includes all transistors (i.e., channels) and nodes that can be reached via transistor channels. In the preferred implementation, the routine also reports any permanently OFF transistors or any hanging nodes, which are nodes that are in groups by themselves and are not connected to any other nodes.

Figure 9:
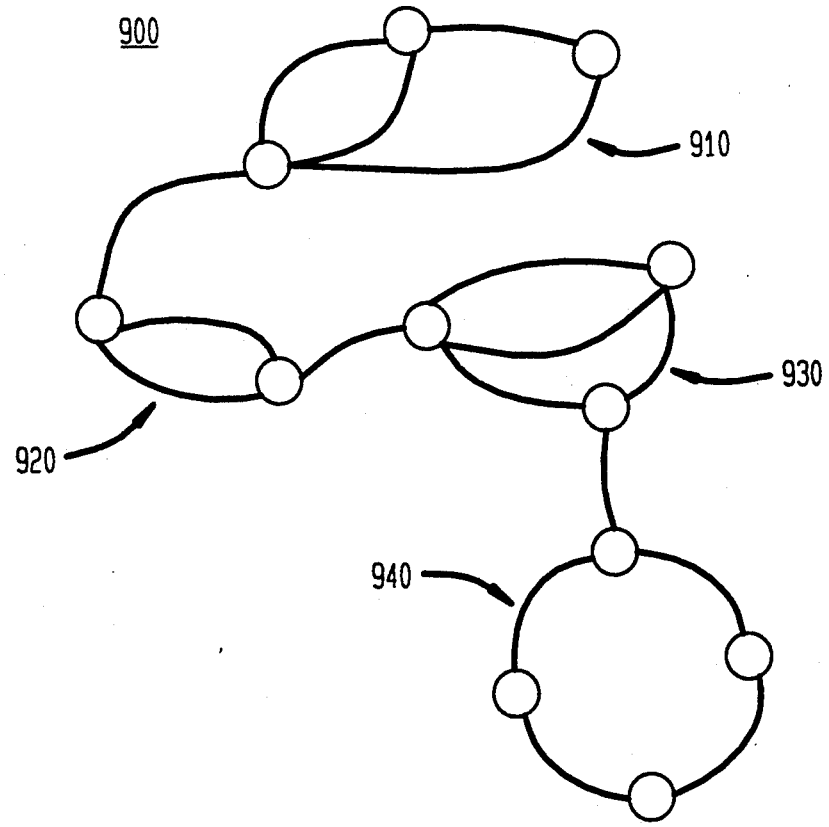
FIG. 9 shows a graph with biconnected components.

Each group is then separated into its biconnected components (step 820). A biconnected component is one in which removal of any node (and all edges connected to it) still leaves a connected component. FIG. 9 shows a graph 900 and its biconnected components 910, 920, 930, and 940. In general, biconnected components (also called bicomponents) with more than one edge have at least two disjoint paths between any pair of nodes.

The separation into biconnected components can be done in linear time using a depth-first search. A depth-first search is one in which a graph is traversed such that once a node is encountered, all the descendants of that node are found before another non-descendant node is examined.

Figure 10:
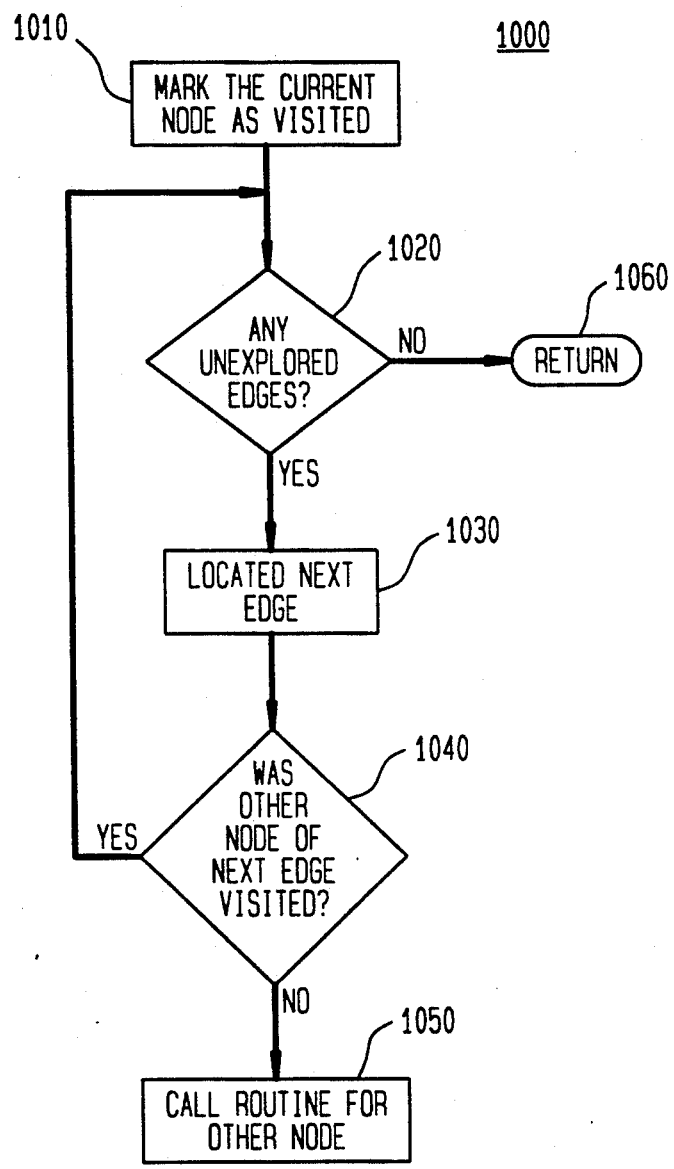
FIG. 10 shows a flow diagram for implementing a depth first search as a self-referential procedure call.

FIG. 10 shows a flow diagram 1000 which implements a depth-first search as a self-referential procedure call. Flow diagram 1000 is for a graph having nodes N connected by edges E, with each of the edges $E_i$ includes two nodes, $n_{i1}$ and $n_{i2}$. Furthermore, for each node $n_{i1}$, there is a list of edges (not shown), called "edge list," which contains all edges connected to node $n_{i1}$. Edge list can be easily built from net list 429.

The first step of flow diagram 1000 is to mark the current node $n_{i1}$ as visited (step 1010). If there are still edges in the edge list for node $n_{i1}$ that have not been explored (step 1020), the next edge in the edge list for $n_{i1}$ is located (step 1030). Once all such edges are located, the other node, $n_{i2}$, of the located edge is examined to see if it has been marked as visited (step 1040). If not, the procedure shown by flow diagram 1000 is called for node $n_{i2}$ (step 1050). If so, its edges are traversed (step 1020).

When all the edges have been explored (step 1020), a return from the procedure in FIG. 10 is executed (step 1060). After the final return, the entire search is complete. The biconnected components of a group form a tree.

Returning to the flow diagram 800, a series-parallel reduction of each biconnected component is performed (step 830). A two-connected component is one which is biconnected but contains no triconnected component. A triconnected component is one in which removal of any two nodes and all edges incident of these two nodes still leaves a connected component or, alternatively, one that has at least three disjoint paths between any pair of nodes.

In the series-parallel reduction, pairs of purely serial edges (those sharing a node shared by no other edge) or purely parallel edges (those sharing both end nodes) are each replaced by a single edge. The series-parallel reduction reduces each biconnected component to a single element if it is two-connected. Otherwise, the reduction results in a set of two-connected elements and single edges.

Figure 11:
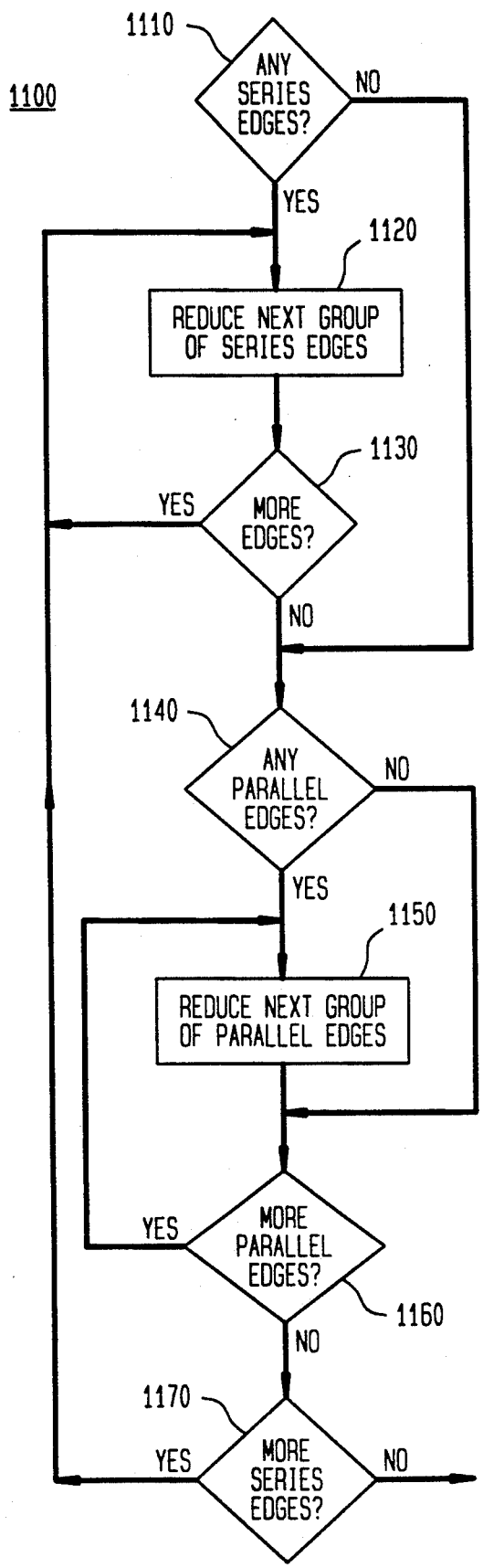
FIG. 11 shows a flow diagram for reducing a graph by means of series-parallel edge reductions.

In the preferred implementation, the reduction occurs in the manner shown by flow diagram 1100 in FIG. 11. In flow diagram 1100, the component is examined for any series edges (step 1110). If any exist, each group of series edges is reduced to a single edge (step 1120). When all series edges are reduced (step 1130), or if none exist (step 1110), the component is examined for all parallel edges (step 1140). If any exist, each group of parallel edges are reduced to a single edge (step 1150). When all the parallel edges are reduced (step 1160), the search for the presence of series edges is undertaken again (step 1170). If any remain, then they are reduced as before. If no series or parallel edges remain, the reduction is complete.

FIGS. 12A–G, which show various states of reduction for graph 600, are used to demonstrate the steps of graph reduction explained above.

In FIG. 12A, the $V_{ss}$ node and all edges connected to the $V_{ss}$ node have been removed to leave the group, which would be separated into its bicomponents at this point, but the $V_{dd}$ group is a single bicomponent in this case.

In FIG. 12B, a series reduction has been used to combine edges 620 and 660 into edge 1210, and edges 640 and 650 into edge 1220. In FIG. 12C, a parallel reduction has been applied to combine edges 680 and 670 into edge 1230. In FIG. 12D, a series reduction is used again to combine edges 607 and 1230 into edge 1240. In FIG. 12E, edges 1210, 1240, and 1220 are combined into an edge which, by parallel and series reduction, is combined to form node 1250.

FIGS. 12F and 12G are alternate representations of the $V_{ss}$ group.

As flow diagram 800 in FIG. 8 indicates, after reduction of the graph, the reduced elements are each organized into nested cycles (step 840). A cycle consists of a set of alternate circuit paths between nodes in the original circuit. For example in FIG. 6, edges 670 and 680, as well as nodes 605 and 637, constitute a cycle. The level of nesting of a cycle indicates how deeply a cycle is nested. The cycle at the topmost level has a nesting level 0.

FIG. 13 shows a graph diagram 1300 to illustrate a method for organizing the levels of the nested cycles. The last (deepest) cycle in the original graph (which had edges 680 and 670) has the highest nesting level (level 2). The next previous cycle reduced had paths 607, 680/670, 1310 (a dummy edge which helps in analysis), 640, and 650. This has a lower level (level 1). The remaining cycle with dummy edges 1320 and 1330 has the lowest level (level 0).

3. Simulation Execution

Once the graph of the circuit is formed and the nesting levels found, simulation can take place (Step 530 in FIG. 5). FIG. 14 shows a flow diagram 1400 of a preferred implementation of the method of simulation in accordance with the present invention. This method of simulation is fast and efficient because it requires very few graph traversals and does not perform unnecessary calculations.

The first task in the simulation method shown in flow diagram 1400 is to determine which nodes that have an active path to a reference node will change levels from the present state (step 1410). This is because only those nodes need to be analyzed for delays. The preferred simulation method assumes the circuit is in a given state wherein some of the nodes have a level 1, some have level 0, and some have an unknown level (X). A node can have an unknown level for many reasons, such as an unknown initial state or an improper logic design.

The preferred method of determining which nodes will change levels is accomplished according to the present invention by the method demonstrated by flow diagram 1500 in FIG. 15. In flow diagram 1500, the driving-point resistances of each node to the reference terminals $V_{dd}$ and $V_{ss}$ nodes are determined (step 1510). The speed of the simulation in the preferred embodiment is keenly dependent upon the speed by which the driving-point resistances are determined because driving-point resistances are repeatedly determined. The present invention envisions techniques for rapid determination of driving-point resistances, and a preferred method for such determination is explained below.

In circuit simulation, however, there are often transistors in an unknown state X. To address the problems of transistors in unknown states, the driving-point resistance in the preferred implementation is computed twice for each of the reference nodes $V_{dd}$ and $V_{ss}$. One computation assumes all the unknown transistors are on, and the other assumes all unknown transistors are off. This is done to gauge the effect on circuit operation of transistors in the unknown state.

After the driving-point resistances are determined, the final state at each node is determined from those driving-point resistances (step 1520). In the preferred implementation, the final state of a node i is determined using the following rule:

If $Rv_{dd,Xoff}(i,i) << RV_{ss,Xon}(i,i)$, then node i state is 1.
If $Rv_{ss,Xoff}(i,i) << Rv_{dd,Xon}(i,i)$, then node i state is 0.

Otherwise node i is in unknown state X. $R_{N,Xon}(i,i)$ is the driving-point resistance between node i and reference node N with all X transistors on, and $R_{N,Xoff}(i,i)$ is the driving-point resistance between node i and reference node N with all X transistors off.

To identify the nodes that change state, computer system 100 compares the level of a node in its final state to its level in the previous state (step 1530).

The next task of the simulation process (FIG. 14) is to determine the delays associated with the nodes that have an active path to a reference node and also change state (step 1420). In the preferred implementation, these driving-point resistances are actually obtained during the graph traversals for delay computation. Performing the resistance determination with the delay determination increases efficiency. The preferred delay computation method is described in the following section.

Next, the state of the nodes which have no active path to either the or the $V_{ss}$ node must be determined (step 1430). The state of these nodes is determined in the preferred implementation by accounting for any charge-sharing that may take place. FIG. 16 is a flow diagram 1600 of a preferred method for determining charge-sharing.

In flow diagram 1600, the first step is to find each set of nodes that is connected to each other by conducting transistors (i.e., active channels), but which has no conducting path to either of the power-supply nodes (step 1610).

Next, the total charge in the set is tallied (step 1620). This is preferably done by finding the sum of the capacitances of the nodes in the "1" state, the sum of the capacitances of the nodes in the "0" state, and the sum of the capacitances in the unknown state.

From the total charge tally, a determination is made whether all nodes will be at state 0 or state 1 after charge sharing (step 1630). This is preferably done by determining whether the capacitances in the "1" or "0" states are more than two times the sum of the capacitances in the other state plus the capacitances in the unknown state. If so, the nodes are set into the determined state (step 1640). If not, then all nodes in the group are assumed to be in unknown state X (step 1650).

After determining their states, the delay of nodes involved in charge sharing is determined (step 1440 in FIG. 14). This is preferably done by first determining the shortest-path spanning tree, setting the length of each edge equal to the resistance of the transistor corresponding to that edge. Next, the Elmore delay (explained below) is computed for the RC-tree corresponding to the shortest-path spanning tree.

4. Events

The preferred implementation of this invention is event-driven. An event is a node that changes state. A list of future events is maintained in an event list 428 stored in data section 427 of memory 420 (FIG. 4). Event list 428, shown in FIG. 17, has an entry (such as entry 1710) for each 10 picosecond time slot in the future. Preferably, event list 428 has ten thousand entries, allowing computations of delays of 100 nanoseconds.

Each entry identifies a number of events, shown for entry 1715 as event entries 1720, 1730, and other nodes which change state during the corresponding time slot. The change in state can either be from an internal signal delay or from an external input.

As FIG. 17 shows, event entry 1710 has a node pointer or identifier 1750, a node value 1760, a field 1770 indicating when the value will change, a type indicator 1780 to specify the type events. Preferably there are three types of events—node event (single node changing), group event (all nodes in a group changing), and circuit event (all nodes in the circuit changing).

FIG. 18 shows a flow diagram 1800 of a preferred method for handling events. First, events scheduled for the current time are removed from the event list (step 1810), and the states of the nodes involved in these events are updated (step 1820).

Next, a determination is made to see whether any of these nodes is the gate of one or more transistors (step 1830). If so, then the groups including those transistors are scheduled for evaluation at the current time because those groups will have experienced a change (step 1840).

When each of these groups is evaluated, future changes are determined (step 1850). Any such change is then scheduled and is inserted in the appropriate place in the event list (step 1860).

The present implementation can also be made more efficient by performing incremental evaluations of groups. When a group is scheduled for evaluation due to changes in the group, it is common to find that at most only one or a few transistors have changed state. Thus, most of the results of the previous evaluation can be used. This is especially true for groups that have a number of bicomponents, since a number of these bicomponents are likely to have not changed at all. Use of incremental evaluation can significantly speed up operation without adding much complexity.

5. Triconnected Components

Although most digital MOS circuits are two-connected or less, and are thus appropriate for the methods described above, there are some circuits which have triconnected components. Triconnected components are reduced in the series-parallel reduction step as far as possible. At that point, each triconnected bicomponent is represented by a number of two-connected components and single edges.

FIG. 19 shows a flow diagram 1900 of a preferred method for evaluating triconnected components. The method uses the path-based approach explained above. As in nodes involved in charge-sharing, the shortest-path algorithm is used to determine the resistance of the shortest path from the $V_{dd}$ and $V_{ss}$ nodes to each node in the component (step 1910). The edges of the graph used in the shortest-path algorithm correspond to the two-connected components that form the triconnected component.

Next, the driving-point resistance of each two-connected component is determined (step 1920). The resistances may be accurately obtained by the two-connected component method described above.

The new states of each node are then determined (step 1930). The preferred mechanism for making such a determination is described with regard to step 1520 in FIG. 15, and involves comparing the shortest-path resistances of each node to the $V_{dd}$ and $V_{ss}$ nodes to determine the new state of each node.

Once the nodes that change state are determined, the delays associated with these changes are computed (step 1940). This is done, as above, by using the shortest-path spanning tree and computing the delays of each node in this RC-tree.

The shortest-path algorithm runs in O(mlogn) time where m is the number of edges and n the number of nodes in the graph. The series-parallel reduction tends to make even a large (>100 transistors) triconnected components relatively small (<10 two-connected edges). The overall running time is essentially linear for real circuits.

The ability to use the two-connected component method in triconnected components significantly increases the effectiveness of this implementation. First, it makes the shortest-path resistance closely approximate the driving-point resistance of a node, thereby preserving accuracy. Second, it maintains the high speed of the simulation because triconnected components only marginally diminish the effectiveness of the implementation.

C. Determination of Delays and Driving Point Resistances in an RC-network

The present invention uses methods of determining delays and driving-point resistances in two-connected RC-networks which run in linear time and space (i.e. O(n)). This feature, which represents a significant improvement over conventional methods, makes this invention applicable to a wider class of circuits than conventional techniques which are limited to RC-trees.

The present invention is also more efficient for two-connected networks than are the conventional techniques designed for wide applications. This is significant because digital MOS circuits are usually more than one-connected (i.e., a tree) but not more than two-connected. Even when a circuit has triconnected components, it usually has only a few, and those triconnected components typically form only a small part of the circuit. Furthermore, the triconnected components themselves, even when large, are usually formed of a small number of two-connected components. All of these characteristics of real circuits make it possible to use this invention to obtain fast and accurate simulations of circuits.

Apart from providing accurate timing information, the ability to compute accurate driving-point resistances provides increased accuracy in resolving situations where a node is being actively driven to both reference terminals $V_{dd}$ and $V_{ss}$. In other simulators, these situations may result in an unknown or unresolved state.

One delay that is used in the preferred implementation and which is amenable to precise description in terms of network parameters is the Elmore delay. Assuming that the initial and final voltages of a signal transition are the same throughout the circuit, the Elmore delay for a RC-network is expressed as $$\Delta = G^{-1}C = RC, \quad (1)$$

where G is the node conductance matrix, where G(i,j) is the branch conductance between nodes i and j when i is not equal to j, and where G(i,i) is the sum of all branch conductances connected to node i. Also, C is the node capacitance vector, such that C(i) is the capacitance of node i. R is the transfer resistance matrix, such that diagonal elements of R, R(i,i), are the driving-point resistances of the network nodes.

An alternative definition of transfer resistance can be explained with the aid of FIG. 20. FIG. 20 shows an RC-network 2000 in which a current $I_i$ is injected at node i (2010). If $V_j$ represents the voltage of node j, the transfer resistance between nodes i and j, with $I_i = 1$, is defined as:

$$R(i,j) = V_j, \text{ where } I_k = 0 \text{ when k does not equal i.} \quad (2)$$

The delay of node i is defined as $$\Delta(i) = \sum_j R(i,j)C(j) \quad (3)$$

The Elmore delay of each node can be computed by inverting G and forming the product with C(i).

D. Application To Two-Connected Networks

1. Simple cycles

The simplest two-connected network is a simple cycle, which is shown diagrammatically in FIG. 21. Because two-connected networks have two node-disjoint paths between any two nodes, a convention will be used in this description to refer to the paths and nodes without ambiguity. Thus, transfer resistances and delays will be determined with respect to a reference such as node 0 (2105) of the network in FIG. 21. A path between nodes does not include the reference node unless the reference node is one or both of the endpoints of the path. Thus, the path (i,j) in FIG. 21 refers to the path containing nodes 2110(i), 2120(p), and 2130(j), and not to the other path through node 2140(k).

To distinguish between the two paths in a simple cycle from the reference node to any other node i, the reference node 0 will be devolved into two logical nodes 0 and 0'. The path obtained by a clockwise traversal from reference node 0 to node i is denoted as (0,i) and is equivalent to the path (i,0). The path obtained by a counter-clockwise traversal is denoted as (0',i) which is equivalent to the path (i,0'). The resistance of the path (i,j) between nodes i and j is denoted by r(i,j) and the capacitance of node i is denoted by c(i).

Using equation (2), the transfer resistance between i and j in a simple cycle as shown in FIG. 21 can be expressed as:

$$R(i,j) = V_j = I(i,j)r(0',j) = \frac{r(0,i)\,r(0',j)}{r(0,i) + r(0',i)} \quad (4)$$

The driving-point resistance R(i,i) of node i is then obtained as:

$$R(i,i) = \frac{r(0,i)\,r(0',i)}{r(0,0')} \quad (5)$$

where $r(0,0') = r(0,i) + r(0',i)$.

The delay $\Delta(i)$ of node i can be expressed as:

$$\Delta(i) = \sum_j R(i,j) C(j) \qquad (6)$$

$$= \frac{1}{r(0,0')} \left( r(0',i) \sum_{j=1}^{i} r(0,j) c(j) + r(0,i) \sum_{j=i+1}^{n-1} r(0',j) c(j) \right)$$

Thus, two traversals of the cycle starting at node 0, one in the clockwise and the other in the counter-clockwise direction, are sufficient to compute the driving-point resistance and delay of each node in a simple cycle.

Because the computation of delays and driving-point resistances in tree RC-networks requires only two traversals of the tree, the computation of simple cycles in accordance with this invention is as efficient as conventional algorithms designed for trees.

2. Nested cycles

A general two-connected network can consist of nested cycles. For purposes of explanation, the cycles will be ordered according to their level of nesting. The outermost cycle will be considered at level 0 and, as explained above, the order may be obtained after a series-parallel reduction of the two-connected network.

FIG. 22A shows a two-connected network 2200 consisting of a nested cycle. The transfer resistance R(i,j) between nodes i (2210) and j (2220) when both are on level 0 is obtained as in equation (4) above. The parallel paths between k (2230) and l (2240) are replaced by their equivalent resistance such that r(k,l) = r(k,p,l)r(k,q,l)/(r(k,p,l)+r(k,q,l)). Thus, the nested cycle in network 2200 can be transformed to an equivalent simple cycle 2250 shown in FIG. 22B for the purpose of computing the transfer resistance between nodes i and j on level 0.

The transfer resistance between node i (2210) on level 0 and node p (2260) on level 1 (FIG. 22A) is obtained in a similar manner. FIG. 22A shows the division of current due to the two parallel paths (k,p,l) and (k,q,l). The current in the branch (k,p,l) is given by:

$$I(k,p,l) = \frac{r(k,q,l) I(l,j)}{r(k,q,l) + r(k,p,l)}$$

$$= \frac{r(k,q,l)}{r(k,q,l) + r(k,p,l)} \frac{r(0,i)}{r(0,0')}$$

The transfer resistance R(i,p), with $I_i = 1$, is then given by the voltage $V_p$ as follows:

$$R(i,p) = V_p = r(p,l)I(k,p,l) + r(0',l)I(l,j) \qquad (7)$$

$$= \frac{r(0,i)r(0',p)}{r(0,0')}$$

where $r(0',p) = \frac{r(k,q,l) r(p,l)}{r(k,p,l) + r(k,q,l)} + r(0',l)$

The effect of a nested cycle is to divide the current into two parallel paths, which is equivalent to reducing the resistance in a branch of the cycle by the ratio of the resistance of the parallel branch and the sum of the resistances of the two parallel branches. Nested cycles of any level can be handled in a similar manner by appropriately reducing the branch resistances each time a new nested cycle is entered.

This method allows computation of the transfer resistance between any node i at level 0 and node j at any level including level 0. As explained below, this also permits computation of the delay of any node at nesting level 0.

For example, the network 2300 of FIG. 23 has two levels of nesting. The transfer resistance R(i,p) is given by:

$$R(i,p) = \frac{r(0,i)}{r(0,0')} \left[ r(0',j) + \frac{r(i,m,j)}{r(i,m,j) + r(i,k,l,j)} \right. \qquad (8)$$

$$\left. \left( r(j,l) + \frac{r(k,q,l)}{r(k,p,l) + r(k,q,l)} r(p,l) \right) \right]$$

Using these methods, the transfer resistances between any node i at level 0 and any other node j may be computed. Equation (3) can then be used to determine the delay of any node at level 0.

3. Delay of nodes at level n

To obtain delay and driving-point resistance of any node at a level greater than 0, the transfer resistance between nodes on level 1 and greater must be analyzed.

FIG. 24 shows a network in which nodes k (2410) and l (2420) are both on the same level greater than 0 and on different branches of a cycle. Because the transfer resistance R(k,l) is equal to the voltage $V_l$ at node l (2420) when a current of $I_k = 1$ is injected at node k (2410), the following equation results:

$$R(k,l) = V_l = V_j + I(i,l,j)r(l,j) \qquad (9)$$

$$= R(k,j) + \frac{R(k,i) - R(k,j)}{r(i,l,j)} r(l,j)$$

$$= \frac{r(l,j) R(k,i)}{r(i,l,j)} + \frac{r(l,i) R(k,j)}{r(i,l,j)}$$

Equation (9) forms the basis for obtaining a linear time algorithm for computing the delay of all nodes because R(k,l) can be computed in constant time for each node l in the branch once R(k,i) and R(k,j) are computed. Equation (9) also allows a two-connected network of level n to be reduced to a network of level n−1 which is at most two-connected. Repeated reductions of this type form the basis of the delay computation algorithm used by this invention.

Equation (9) may also be used in the manner described below to perform capacitance distribution and concentration for efficient delay computation. In FIG. 24, the contribution of node l (2420) to the delay of node k (2410) is R(k,l)c(l). This capacitance of c(l) can be equivalently distributed to nodes i (2430) and j (2440) of FIG. 24 by replacing c(l) by the additional capacitances at node i (2430) of c(l)r(l,j)/r(i,l,j), and at node j (2440) the additional capacitances of c(l)r(l,i)/r(i,l,j). From equation (9), it can be determined that the delay of node k (2410) is unaffected by this transformation.

The nested cycle of FIG. 25A will be used to illustrate how to apply the capacitance distribution mechanism. The capacitances c(m) and c(n) in the branch (i,m,n,j) are distributed to the nodes i (2510) and j (2520) according to equation (9) so that:

$$c(i) = c(i) + \frac{r(m,j)}{r(i,m,j)} c(m) + \frac{r(n,j)}{r(i,m,j)} c(n)$$

-continued
$$c(j) = c(j) + \frac{r(i,m)}{r(i,m,j)} c(m) + \frac{r(i,n)}{r(i,m,j)} c(n)$$

This is shown in FIG. 25B as the first transformation. This capacitance distribution eliminates the capacitances in the branch (i,m,n,j).

Next, the capacitances in the branch (0',t,s,j) are concentrated at node j (2520) in preparation for performing a DELTA-WYE reduction, as follows:

$$c(j) = c(j) + \frac{c(t)r(0',t) + c(s) r(0',s)}{r(0',t,s,j)}.$$

This second transformation is shown in FIG. 25C.

Then, the level 1 cycle (i,m,n,j,l,k,i) is reduced by performing a DELTA-WYE reduction as shown. This introduces the intermediate node 0'' (2530) shown in FIG. 25C. The resistances of the three branches in the WYE configuration are as follows:

$$r(0,0'') = \frac{r(0,i)r(0',j)}{r(0,i) + r(0',j) + r(i,m,j)}$$

$$r(0'',i) = \frac{r(0,i)r(i,m,j)}{r(0,i) + r(0',j) + r(i,m,j)}$$

$$r(0'',j) = \frac{r(0',j)r(i,m,j)}{r(0,i) + r(0',j) + r(i,m,j)}.$$

The previous procedure can be employed for nodes at level 0 to determine the transfer resistances and delays between any node at level 0 and any other node. Repeated application of this procedure obtains the transfer resistances in a two-connected network of any level.

E. Method of Determining

As explained above with regard to equation (6), determination of delay does not require the determination of transfer resistance between all nodes. If this were not the case, the execution time would be much greater.

FIG. 26 is a flow chart 2600 for a preferred method of determining the delays of each node whose logic level has changed. First, the delays of all nodes at level 0 are determined (step 2610) in the manner described above.

Next, for each parallel branch of the cycle at level 1, a reduced network is obtained (step 2620). This is preferably obtained using capacitance distribution of the other branches, as described by equation (8), and DELTA-WYE reductions.

The delay computation is performed for the nodes on level 0 of the reduced network (step 2630). Again, the techniques explained above can be used.

Next, the delay computation is repeated for any nested cycles in this branch (step 2640). When the current branch has been completely traversed, the process is repeated for the next parallel branch (step 2650).

F. Traversing the Two-connected Network.

The power of the methods discussed above derive in part from the fact that the calculations may be done in a linear traversal of the circuit networks. A two-connected network is traversed in both the clockwise and counter-clockwise directions starting at the reference node 0(0'). When a cycle is encountered, each parallel branch of the cycle is traversed separately from the head to the tail of the cycle. The RC product at a node i obtained by the clockwise traversal is denoted as $RC_c(i)$ and that obtained by the counter-clockwise traversal is denoted by $RC_a(i)$. Similarly, the path resistances obtained for clockwise and counter-clockwise traversal will be denoted by $r_c(i)$ and $r_a(i)$, respectively, and the path capacitances will be denoted by $c_c(i)$ and $c_a(i)$, respectively. All these parameters are with respect to the reference node 0(0') if node i is on level 0, or with respect to the head or tail of the cycle at level n containing node i if node i is at level n.

FIG. 27 is a flow diagram 2700 of a preferred method for traversing a circuit network. The network is traversed first in the clockwise direction starting at the reference node 0 (step 2710). For node 0, $r_c(0) = c_c(0) = RC_c(0) = 0$. As each node i at level 0 is visited, the parameters are determined (step 2720), preferably as follows:

$$r_c(i) = r_c(i-1) + r(i-1,i)$$

$$c_c(i) = c_c(i-1) + c(i)$$

$$RC_c(i) = RC_c(i-1) + r_c(i)c(i).$$

This clearly requires constant time per node.

When a nested cycle is encountered (step 2730), each branch is traversed separately (step 2740). For each branch, the resistance, capacitance, and RC product are computed from head node h to each node (step 2750).

Once all branches of a cycle have been traversed (step 2760), the parameters for the tail node t are computed (step 2770). Preferably, capacitance $c_c(t)$ is set to the sum of capacitances in each branch and that of head node h; path resistance $r_c(t)$ is set to the sum of $r_c(h)$ and the equivalent resistance of all the branches in parallel; and path RC product $RC_c(t)$ is obtained by reducing the RC product from each branch by the ratio in which the current entering the cycle divides, and adding the result to $RC_c(h)$. The ratio by which each branch RC product is reduced is the ratio of the branch resistance and the sum of resistances of the parallel branch and itself.

Once all nodes have been traversed in the clockwise direction (step 2780), the same steps are repeated in the counter-clockwise direction starting at the reference node 0'.

Figure 28A:
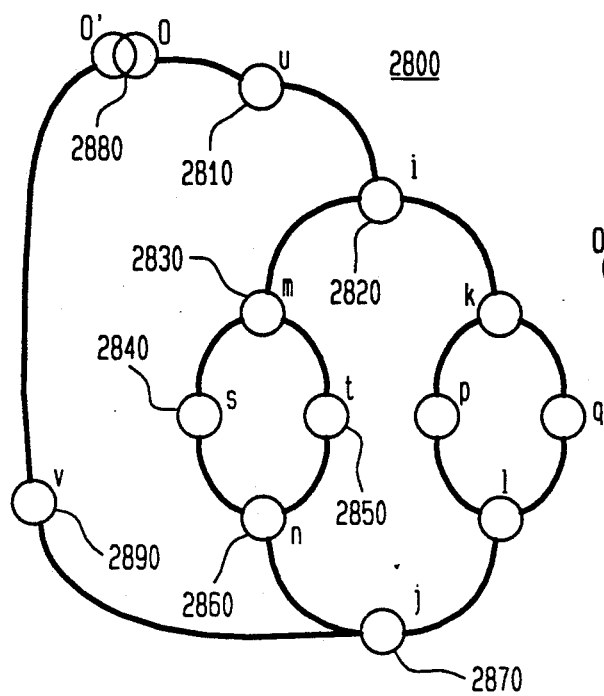

This traversal may be illustrated with the aid of network 2800 of FIG. 28A. For the clockwise traversal the parameters for nodes u (2810) and i (2820) are computed as before. When the cycle at node i (2820) is encountered, the two parallel branches are traversed separately. For branch (i,m,n,j):

$$r_c(m) = r(i,m); c_c(m) = c(m); \text{ and } RC_c(m) = r_c(m)c_c(m).$$

All these parameters are computed with respect to node i (2820).

On encountering the cycle at node m (2830), the two branches (m,s,n) and (m,t,n) are traversed separately computing the path resistance and RC product of nodes s (2840) and t (2850) from node m (2830).

At node n (2860), the parameters for branch (m,s,n) are denoted by the subscript 1 and those for branch (m,t,n) by the subscript 2. The parameters are computed as follows:

$$r_c(n) = r_c(m) + \frac{r_{c1}(n) r_{c2}(n)}{r_{c1}(n) + r_{c2}(n)}$$

where

-continued $$r_{c1}(n) = r_c(s) + r(s,n);$$

$$r_{c2}(n) = r_c(t) + r(t,n);$$

and $$c_c(n) = c(n) + c_c(m) + c_c(s) + c_c(t)$$

$$RC_c(n) = RC_c(m) + \frac{RC_c(s) r_{c2}(n)}{r_{c1}(n) + r_{cw}(n)} + \frac{RC_c(t)r_{c1}(n)}{r_{c1}(n) + r_{c2}(n)}$$

Again, all these computations can be performed in constant time per node or per branch of a cycle.

Branch (i,k,l,j) is then traversed in a similar manner, and the clockwise traversal is completed by computing for the nodes j (2870) and v (2890). The computation for node j (2870) is similar to that of node n (2860).

The counter-clockwise traversal from node 0' (2880) is similar. The only difference between the clockwise and counter-clockwise traversals is that $RC_c(i)$ includes the contribution of node i (2820), $r_c(i)c(i)$, whereas $RC_a(i)$ does not include the contribution of node i. This ensures that the contribution of node i (2820) is counted once.

G. Computing Delay of Level 0 Nodes

At node u (2810) of FIG. 28, the delay $\Delta(u)$ is computed as:

$$\Delta(u) = \frac{RC_c(u)r_a(u) + RC_a(u)r_c(u)}{r_c(u) + r_a(u)} \quad (10)$$

The same applies for the other nodes at level 0, namely, nodes i (2820), j (2870) and v (2890). The delays Of these nodes could be computed during the counter-clockwise traversal phase itself, and this computation also consumes a constant time per node.

H. Computing Delay of Level 1 Nodes

When a cycle at level 1 is encountered, a capacitance concentration and a capacitance distribution are applied. Capacitance concentration accounts for the contribution of all nodes on level 0 to the delay of nodes on level 1 and higher. For example, in FIG. 28A, the capacitance of node i (2820) is increased from c(i) to $RC_c(i)/r_c(i)$, and the capacitance at node j (2870) is increased from c(j) to $c(j)+RC_a(j)/r_a(j)$. The difference in the two equations reflects the fact that $RC_c(i)$ includes the contribution of node i (2820) whereas $RC_a(j)$ does not include the contribution of node j.

Capacitance distribution accounts for the capacitances of nodes in parallel branches. For example, to compute the delays in branch (i,k,l,j), the contributions of nodes m (2830), t (2850), s (2840) and n (2860) are obtained using the capacitance distribution mechanism described above. This increases the capacitance of node i (2820) by $RC_a(m)/r(i,m,n,j)$ and that of node j by $RC_c(n)/r(i,m,n,j)$. The result of these two mechanisms is the network 2855 shown in FIG. 28B.

Figure 28C:
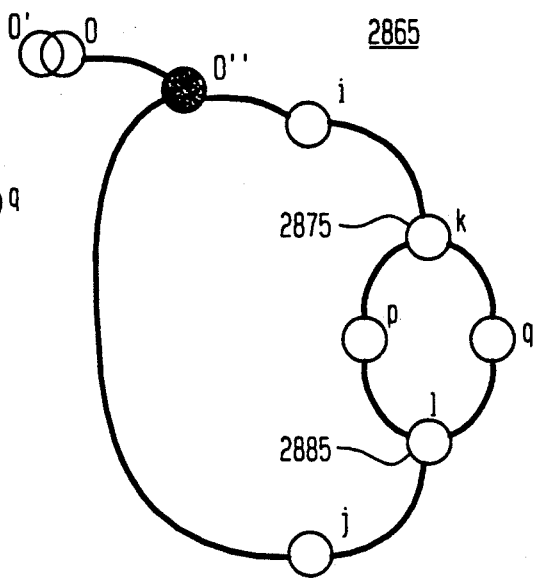
Figure 28B:
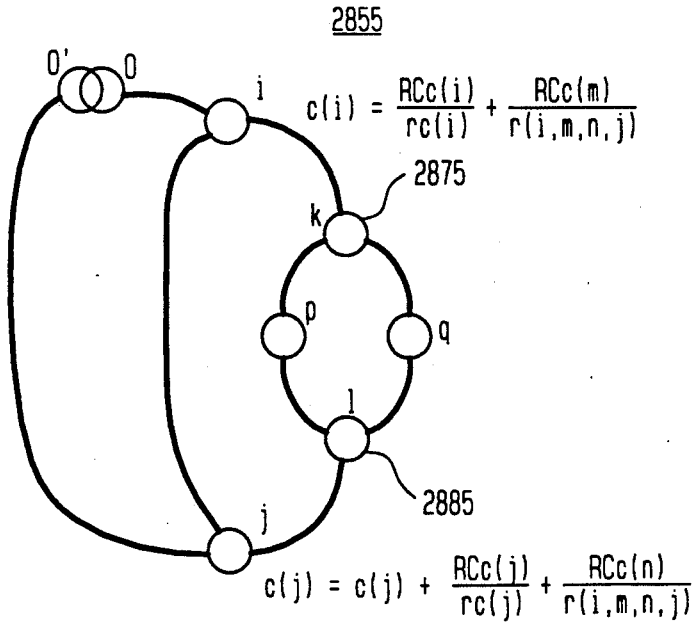

Next, a DELTA-WYE transformation is performed to obtain network 2865 of FIG. 28C. Nodes k (2875) and 1 (2885), which were on level 1 in FIG. 28A, are now on level 0 of this cycle. Once this transformation is complete, the new resistance, capacitance, RC parameters and delay for all nodes now on level 0 may be computed. For node k:

$$r_c(k) = r_c(k) + r(0'',i)$$

$$r_a(k) = r_a(k) + r(0'',j)$$

$$c_c(k) = c_c(k) + c(i)$$

$$c_a(k) = c_a(k) + c(j)$$

$$RC_c(k) = RC_c(k) + r(0'',i)c_c(k)$$

$$RC_a(k) = RC_a(k) + r(0'',j)c_a(k)$$

And finally, the delay $\Delta(k)$ is computed as:

$$\Delta(k) = \frac{RC_c(k)r_a(k) + RC_a(k)r_c(k)}{r_c(k) + r_a(k)} + r(0,0'')\{c_c(k) + c_a(k)\} \quad (11)$$

This equation differs from equation (10) in the last term which is needed to account for the resistance r(0,0'') in FIG. 28(C) driving the two-connected network rooted at 0''. All these computations require constant time per node.

Once the branch (i,k,l,j) has been fully traversed, the process is repeated with the other branch (i,m,n,j).

I. Results

Table 1 shows for a small list of circuits a comparison of the performance of an implementation of this invention, called Gonga, and that of a timing simulator (EMU). The EMU timing simulator represents circuits as a set of differential equations which are solved in an expeditious manner. The simulation speed of Gonga was found to be between fifteen and thirty-five times faster than that of the EMU timing simulator.

TABLE 1

| Circuit | Size | CPU time (sec.) Gonga | EMU | Speed-up |
|---------|------|-------|-----|----------|
| afa | 26 | 5 | 75 | 15 |
| prefilter | 1000 | 22 | 762 | 35 |
| fef | 5000 | 31 | 933 | 30 |

FIGS. 29A and 29B shows the simulated responses of an inverter from the Gonga and EMU simulators, respectively. The lower traces representing the inputs are very similar, but the upper traces are very different. The Gonga implementation in FIG. 29A is essentially a two-valued representation that shows when state changes occur. In the EMU outputs of FIG. 29B, however, the upper trace shows the charging and discharging of the output node. Although FIG. 29B may be a more accurate representation of the precise waveform, the state changes, which are approximately at the midpoints of the leading and trailing edges of the output node signal, occur at the same time as those determined by the Gonga simulation in FIG. 29A.

FIGS. 30A and 30B show the results from Gonga and EMU simulators, respectively, for a 4-transistor exclusive OR gate, and again demonstrate the accuracy of the simulation of this invention. The exclusive OR gate is a particularly difficult circuit to simulate correctly and accurately at the switch-level. The drivers for this gate have the same size as the four transistors comprising the exclusive OR gate. The simulation is logically correct (without any manual intervention as required by a number of switch-level simulators) as well as being reasonably close in timing. Timing accuracy of this nature for this circuit cannot be expected from other switch-level simulators.

V. CONCLUSION

A method of switch-level timing simulation according to this invention provides accurate timing and fast simulation speeds. The methods for determining driving-point resistances and delays in two-connected RC-networks run in linear time and provide both accuracy and speed. Improved speed is also attained by taking advantage of evaluating only the bicomponents (and possibly even smaller entities) that change, rather than evaluating the entire group.

What is claimed is:

1. A method of simulating a circuit of transistors and reference terminals and determining driving-point resistances in linear time and space, said method comprising the steps, executed by a data processor having memory means, of generating a model of the transistor circuit as an RC-network representation of the transistor circuit, said representation being other than an RC-tree network and comprising a plurality of switches each corresponding to a different one of the transistors and each of the switches containing a gate and two nodes connected by a corresponding channel having a resistance value such that each channel is considered conducting or nonconducting according to the state of the corresponding gate;

storing in said circuit memory means said representation of the transistor circuit including said resistance value for each of said channels;

defining a state configuration for a given state of the RC-network representation, the defined state configuration containing channels which would be considered conducting in that given state and nodes connected to the conducting ones of the channels;

determining, from the resistance values for the channels in the defined state configuration, the driving point resistances between each of the nodes in the defined state configuration and the reference terminals; and each of said nodes having a corresponding capacitance value, determining the delay for the transition from the given state tot he next state from the driving point resistances in the defined state configuration and from the capacitance values of the nodes contained in the defined state configuration;

whereby the time required for said method is essentially proportional to the number of nodes and the circuit memory means required for said method is also essentially proportional to the number of nodes.

2. The method of claim 1 ,wherein the step of determining corresponding driving-point resistances for each of the nodes includes the substeps of determining, for each of the nodes, a first driving-point resistance between the corresponding node and a first one of the reference terminals for the given configuration; and determining, for each of the nodes, a second driving-point resistance between the corresponding node and a second one of the reference terminals for the given configuration.

3. The method of claim 2 wherein the state of a set of transistors is unknown and wherein the substeps of determining the first and second driving-point resistances further include the substeps of determining the first driving-point resistance with the channels of all the transistors in the set being in the given configuration, and determining the second driving-point resistance with none of the channels in the set being in the given configuration.

4. A method of simulating a circuit of transistors and reference terminals and determining driving-point resistances in linear time and space, said method comprising the steps, executed by a data processor having memory means, of generating a model of the transistor circuit as an RC-network representation of the transistor circuit, said representation being other than an RC-tree network and comprising a plurality of switches each corresponding to a different one of the transistors and each of the switches containing a gate and two nodes connected by a corresponding channel having a resistance value such that each channel is considered conducting or nonconducting according to the state of the corresponding gate;

storing in said circuit memory means said representation of the transistor circuit including said resistance value for each of said channels;

defining a state configuration for a given state of the RC-network representation by representing the transistor circuit as a graph with edges corresponding to the channels contained in the defined state configuration, the defined state configuration containing channels that would be considered conducting in that given state and nodes connecting ones of the channels;

identifying parallel paths between nodes in the graph as cycles by separating the graph into channel-connected components, separating each channel-connected component into bi-connected components, and performing series and parallel reductions on the bi-connected components to obtain a reduced graph;

determining a level of nesting for each of the identified cycles by noting the nesting levels of the cycles according to the graph reductions; and determining from the resistance values for the channels in the defined state configuration the driving point resistances between each of the nodes in the defined state configuration and the reference terminals, including determining the driving-point resistances of the nodes in the cycles having lower levels before determining the driving point resistance of nodes in cycles having higher levels, whereby the time required for said method is essentially proportional to the number of nodes and the circuit memory means required for said method is essentially proportional the number of nodes.

5. A method in accordance with claim 4 wherein each of the nodes has a corresponding capacitance value and further comprising determining the delay for the transistor from the given state to the next state from the driving point resistances in the defined state configuration and from the capacitance values of the nodes contained in the defined state configuration.

6. A method in accordance with claim 5 wherein the determination of the driving point resistances and of the delays involves only two traversals in opposite directions at the nodes of the RC-network representation.

* * * * *